(12) United States Patent
Uchida et al.

(10) Patent No.: US 10,434,751 B2
(45) Date of Patent: Oct. 8, 2019

(54) LAMINATE, FOOD PACKAGING MATERIAL, AND METHOD FOR PRODUCING LAMINATE

(71) Applicant: MITSUI CHEMICALS, INC., Tokyo (JP)

(72) Inventors: Takashi Uchida, Chiba (JP); Chikako Kouda, Sodegaura (JP); Hoang Yen Dinh, Tokyo (JP)

(73) Assignee: MITSUI CHEMICALS, INC., Tokyo (JP)

( * ) Notice: Subject to any disclaimer, the term of this patent is extended or adjusted under 35 U.S.C. 154(b) by 0 days.

(21) Appl. No.: 15/556,306

(22) PCT Filed: Mar. 11, 2016

(86) PCT No.: PCT/JP2016/057724
§ 371 (c)(1),
(2) Date: Sep. 7, 2017

(87) PCT Pub. No.: WO2016/143889
PCT Pub. Date: Sep. 15, 2016

(65) Prior Publication Data
US 2018/0037005 A1    Feb. 8, 2018

(30) Foreign Application Priority Data

Mar. 11, 2015   (JP) ................. 2015-048262

(51) Int. Cl.
*B32B 15/095*   (2006.01)
*B65D 65/40*    (2006.01)
(Continued)

(52) U.S. Cl.
CPC ............ *B32B 15/095* (2013.01); *B32B 15/20* (2013.01); *B32B 27/40* (2013.01); *B65D 65/40* (2013.01);
(Continued)

(58) Field of Classification Search
CPC ........ B05D 1/28; B05D 3/144; B32B 15/095; B32B 15/20; B32B 2250/03;
(Continued)

(56) References Cited

U.S. PATENT DOCUMENTS

2003/0055197 A1* 3/2003 Morikawa ............ C08G 18/283
528/44
2003/0207122 A1  11/2003 Uchida
(Continued)

FOREIGN PATENT DOCUMENTS

CN          101778878         7/2010
EP             2172500 A1     4/2010
(Continued)

OTHER PUBLICATIONS

International Search Report dated Jun. 14, 2016 filed in PCT/JP2016/057724.
(Continued)

*Primary Examiner* — Thao T Tran
(74) *Attorney, Agent, or Firm* — Rankin, Hill & Clark LLP

(57) ABSTRACT

In a laminate film 1 including a substrate 2, a polyurethane layer 3 formed on the substrate 2, and a metal vapor deposition layer 4 formed on the polyurethane layer 3, a coating liquid is applied on the substrate 2 and dried to produce the polyurethane layer 3. The coating liquid contains a water dispersible polyisocyanate and a polyurethane dispersion containing polyurethane resin produced by reaction of an isocyanate group-terminated prepolymer with a chain extender. The isocyanate group-terminated prepolymer is produced by reaction of a polyisocyanate component including xylylene diisocyanate and/or hydrogenated xylylene diisocyanate and a polyol component including
(Continued)

diol having 2 to 6 carbon atoms and an active hydrogen group-containing compound containing a hydrophilic group.

8 Claims, 1 Drawing Sheet

(51) Int. Cl.
 *B32B 15/20* (2006.01)
 *B32B 27/40* (2006.01)
 *B05D 1/28* (2006.01)
 *B05D 3/14* (2006.01)
 *C23C 14/20* (2006.01)

(52) U.S. Cl.
 CPC .............. *B05D 1/28* (2013.01); *B05D 3/144* (2013.01); *B32B 2250/03* (2013.01); *B32B 2307/7244* (2013.01); *B32B 2439/70* (2013.01); *C23C 14/20* (2013.01)

(58) Field of Classification Search
 CPC ........ B32B 2307/7244; B32B 2439/70; B32B 27/40; B65D 65/40; C23C 14/20
 USPC ............................ 428/425.8, 425.9; 427/497
 See application file for complete search history.

(56) References Cited

U.S. PATENT DOCUMENTS

| | | |
|---|---|---|
| 2007/0031679 A1 | 2/2007 | Ushida |
| 2009/0263654 A1 | 10/2009 | Hirota |
| 2010/0189937 A1 | 7/2010 | Ogawa et al. |
| 2012/0016075 A1 | 1/2012 | Uchida |
| 2016/0159965 A1 | 6/2016 | Uchida |
| 2018/0037002 A1* | 2/2018 | Yamazaki ................ B32B 9/00 |

FOREIGN PATENT DOCUMENTS

| | | |
|---|---|---|
| JP | 11100659 A2 | 4/1999 |
| JP | 2001098047 A2 | 4/2001 |
| JP | 2003205569 A2 | 7/2003 |
| JP | 2005139436 A2 | 6/2005 |
| JP | 2009154425 A2 | 7/2009 |
| JP | 2010229291 A2 | 10/2010 |
| JP | 2011131391 A2 | 7/2011 |
| WO | 2008035557 A1 | 3/2008 |
| WO | 2009014162 A1 | 1/2009 |
| WO | 2010110076 A1 | 9/2010 |
| WO | 2012039259 A1 | 3/2012 |
| WO | 2015016069 A1 | 2/2015 |

OTHER PUBLICATIONS

International Preliminary Report on Patentability dated Sep. 21, 2017 filed in PCT/JP2016/057724 total 14 pages.
Handbook of Raw Materials and Additives for Polyurethanes, p. 62, Jan. 31, 2013; Cited in Chinese OA.

* cited by examiner

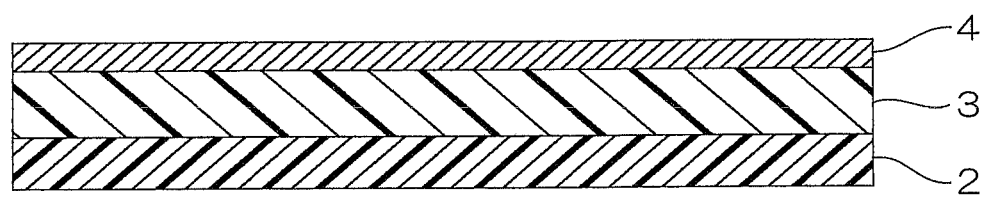
1

LAMINATE, FOOD PACKAGING MATERIAL, AND METHOD FOR PRODUCING LAMINATE

TECHNICAL FIELD

The present invention relates to a laminate, a food packaging material, and a method for producing a laminate. In particular, the present invention relates to a laminate, a food packaging material including the laminate, and a method for producing the laminate.

BACKGROUND ART

Conventionally, in the field of packaging materials, films having excellent gas barrier properties have been used. Patent Document 1 has proposed, for such a packaging film, a gas barrier composite film produced by forming a layer including gas barrier polyurethane resin produced by allowing a diisocyanate component to react with a diol component including C2 to 8 alkylglycol, and a substrate film layer; and a gas barrier composite film produced by further forming an inorganic layer on at least one surface of the substrate film layer by vapor deposition or sputtering (e.g., see Patent Document 1 below).

CITATION LIST

Patent Document

Patent Document 1: Japanese Unexamined Patent Publication No. 2001-98047

SUMMARY OF THE INVENTION

Problem to be Solved by the Invention

Examinations by the inventors of the present invention revealed the results that adherence between layers, gas barrier properties, especially oxygen barrier properties were not sufficient with a laminate produced by forming the above-described inorganic layer on a substrate of hydrocarbon such as polyolefin sheet or polyolefin film.

Furthermore, in the embodiment in which a layer of urethane resin applied thereon is combined, a component used for forming the application layer, and the order of the layer configuration brings very different results in gas barrier properties and interlayer adhesive strength.

For example, with the configuration of a polyolefin sheet/ an inorganic layer (metal vapor deposition layer)/a urethane resin layer, depending on the types of the urethane resin layer (that is, the component used for forming the application layer), the results of interlayer adhesive strength were very much different. It has been known that interlayer adhesive strength between the polyolefin sheet and the inorganic layer (metal vapor deposition layer) is low, and it has been assumed that this phenomenon is because pinholes are generated in the inorganic layer (metal vapor deposition layer).

That is, it has been assumed that in the laminate having a polyolefin sheet as the substrate, gas barrier properties and adhesive strength are not determined by addition of the properties of the each layer, but the orders of the layers and the layer configuration greatly affect such properties.

Furthermore, examinations by the inventors of the present invention revealed the results that interposing a layer including the above-described gas barrier polyurethane resin between the substrate of hydrocarbons such as a polyolefin sheet and a polyolefin film and an inorganic layer (metal vapor deposition layer) makes the interface adherence therebetween insufficient.

Thus, an object of the present invention is to provide a laminate having excellent gas barrier properties and adherence, preferably with excellent heat sealability, a food packaging material including the laminate, and a method for producing the laminate.

Means for Solving the Problem

The present invention [1] includes a laminate preferably including a substrate composed of a heat sealable plastic film, a polyurethane layer formed on the substrate, and a metal vapor deposition layer formed on the polyurethane layer, wherein the polyurethane layer is produced on the substrate by applying and drying a coating liquid containing a water dispersible polyisocyanate and a polyurethane dispersion containing polyurethane resin produced by reaction of an isocyanate group-terminated prepolymer with a chain extender, the isocyanate group-terminated prepolymer is produced by reaction of a polyisocyanate component including xylylene diisocyanate and/or hydrogenated xylylene diisocyanate and a polyol component including diol having 2 to 6 carbon atoms and an active hydrogen group-containing compound containing a hydrophilic group.

The present invention [2] includes the laminate of the above-described [1], wherein the mass ratio (resin component in polyurethane dispersion/resin component in water dispersible polyisocyanate) of the resin component in the polyurethane dispersion to the resin component in the water dispersible polyisocyanate is in the range of 2/1 to 99/1.

The present invention [3] includes the laminate of the above-described [1] or [2], wherein the substrate is a cast polyolefin film.

The present invention [4] includes the laminate of any one of the above-described [1] to [3], wherein the metal vapor deposition layer is an aluminum layer.

The present invention [5] includes a food packaging material including the laminate of any one of the above-described [1] to [4].

The present invention [6] includes a laminate including a substrate, a polyurethane layer, and a metal vapor deposition layer formed in this order, wherein the substrate is a polyolefin film, and the polyurethane layer contains the following groups at the percentage below:
(A) xylylene group and/or hydrogenated xylylene group: 10 mass % or more and 45 mass % or less,
(B) alkylene group having 2 to 6 carbon atoms: 0.5 mass % or more and 25 mass % or less, and
(C) polyalkylene oxide group: 0.5 mass % or more and 10 mass % or less,
(where the polyurethane layer as a whole is 100 mass %).
The present invention [7] includes the laminate of the above-described [6], wherein the polyurethane layer further contains the following groups at the percentage below:
(D) alkylene group containing an ionic group and/or arylene group containing an ionic group: 1 mass % or more and 25 mass % or less.
The present invention [8] includes the laminate of the above-described [6] or [7], wherein the polyurethane layer further contains the following groups at the percentage below:
(E) at least one group selected from the group consisting of an alkylene group having an amino group, an arylene group having an amino group, an alkylene group having a thiol group, and an arylene group having a thiol group: 1 mass % or more and 25 mass % or less.

The present invention [9] includes a food packaging material including the laminate of any one of the above-described [6] to [8].

The present invention [10] includes a method for producing a laminate, the method including forming a polyurethane layer on a substrate composed of a heat sealable plastic film, and forming a metal vapor deposition layer on the polyurethane layer, thereby producing a laminate, wherein in the formation of the polyurethane layer, a coating liquid is applied on the substrate and dried, the coating liquid contains polyurethane dispersion and water dispersible polyisocyanate, the polyurethane dispersion contains polyurethane resin produced by reaction of an isocyanate group-terminated prepolymer and a chain extender, the isocyanate group-terminated prepolymer is produced by reaction of a polyisocyanate component including xylylene diisocyanate and/or hydrogenated xylylene diisocyanate and a polyol component including diol having 2 to 6 carbon atoms and an active hydrogen group-containing compound containing a hydrophilic group.

Effects of the Invention

The laminate of the present invention includes a polyurethane layer between the substrate composed of a heat sealable plastic film and a metal vapor deposition layer, and the polyurethane layer is produced by applying a coating liquid on the substrate and drying the coating liquid. The coating liquid contains polyurethane dispersion and water dispersible polyisocyanate, the polyurethane dispersion contains polyurethane resin, the polyurethane resin is produced by reaction of an isocyanate group-terminated prepolymer with a chain extender, the isocyanate group-terminated prepolymer is produced by reaction of a polyisocyanate component including xylylene diisocyanate and/or hydrogenated xylylene diisocyanate and a polyol component including diol having 2 to 6 carbon atoms and an active hydrogen group-containing compound containing a hydrophilic group.

Therefore, the laminate and the food packaging material including the laminate of the present invention have excellent adherence between the substrate composed of a heat sealable plastic film and the metal vapor deposition layer, and furthermore, have excellent gas barrier properties.

In the laminate of the present invention, the substrate/polyurethane layer/metal vapor deposition layer are formed in this order, the substrate is a polyolefin film, and the polyurethane layer contains a predetermined group at a predetermined percentage.

Therefore, the laminate and the food packaging material including the laminate of the present invention have excellent adherence between the substrate composed ofa polyolefin film and the metal vapor deposition layer, and also have excellent gas barrier properties.

With the method for producing a laminate of the present invention, the above-described laminate can be produced efficiently.

BRIEF DESCRIPTION OF THE DRAWINGS

FIG. 1 is a schematic view illustrating an embodiment of a laminate of the present invention.

DESCRIPTION OF EMBODIMENTS

In FIG. 1, a laminate film 1 as an embodiment of the laminate of the present invention includes a substrate 2, a polyurethane layer 3 disposed on the surface of the substrate 2, and a metal vapor deposition layer 4 disposed on the surface of the polyurethane layer 3.

For the substrate 2, preferably, a polyolefin film (including heat sealable polyolefin film and heat unsealable polyolefin film) is used.

For the polyolefin film, to be specific, a low-density polyethylene film, straight chain low-density polyethylene film, cast (unoriented) polypropylene film (CPP film), uniaxially oriented polypropylene film, biaxially oriented polypropylene film (OPP film), and 4methyl-1-pentene polymer film are used.

The substrate 2 is preferably composed of a heat sealable plastic film. The heat sealable plastic film is a film that can adhere by applying heat and pressure, and also can keep its shape at the thermal adhesion temperature (e.g., 90° C. or more and 160° C. or less).

Examples of such a heat sealable plastic film include a cast resin polyolefin film (heat sealable polyolefin film) composed of polyethylene or polypropylene, and has thermal adhesion properties, to be specific, for example, a cast polypropylene film (CPP film), and a low-density polyethylene film (LLDPE film). The laminate 1 in which these cast resin polyolefin films (heat sealable polyolefin film) are used as the substrate 2 has heat sealability and furthermore, has excellent gas barrier properties.

The substrate 2 is composed of a single layer, or a laminate of layers of the same type or two or more types.

The substrate 2 can be subjected to surface treatment (corona discharge treatment, etc.), anchor coat treatment, or under coat treatment. Of these treatments, anchor coat treated substrates and corona discharge treated substrates are preferable, corona discharge treated substrates are more preferable.

For the substrate 2, in view of improving gas barrier properties and adherence, preferably, a cast polyolefin film is used.

The substrate 2 has a thickness of, for example, 3 μm or more, preferably 5 μm or more, and for example, 500 μm or less, preferably 200 μm or less.

The polyurethane layer 3 is a resin layer including polyurethane resin to be described later.

The polyurethane layer 3 preferably includes the groups (A) to (C) below, and more preferably, further includes the group of (D) below, and/or, the group of (E) below:

(A) xylylene group and/or hydrogenated xylylene group
(B) alkylene group having 2 to 6 carbon atoms
(C) polyalkylene oxide group
(D) alkylene group containing an ionic group, and/or, arylene group containing an ionic group
(E) at least one group selected from the group consisting of an alkylene group having an amino group, arylene group having an amino group, alkylene group having a thiol group, and arylene group having a thiol group.

(A) Xylylene group and/or hydrogenated xylylene group are preferably introduced into the polyurethane layer 3 by using xylylene diisocyanate (described later) and/or hydrogenated xylylene diisocyanate (described later) as materials of the polyurethane layer 3.

(A) Xylylene group and/or hydrogenated xylylene group is introduced into the polyurethane layer 3 also by using, for example, water dispersible polyisocyanate (described later) derived from the polyisocyanate having a xylylene group and/or a hydrogenated xylylene group.

The (A) xylylene group and/or hydrogenated xylylene group content (total amount) is, when the polyurethane layer 3 as a whole is 100 mass %, for example, 10 mass % or more, preferably 12 mass % or more, more preferably 15 mass % or more, and for example, 45 mass % or less, preferably 40 mass % or less, more preferably 35 mass % or less.

(B) Alkylene group having 2 to 6 carbon atoms is introduced into the polyurethane layer 3 by preferably using diol having 2 to 6 carbon atoms (described later) as materials of the polyurethane layer 3.

(B) Alkylene group having 2 to 6 carbon atoms is contained (total amount) in an amount of, when the polyurethane layer 3 as a whole is 100 mass %, for example, 0.5 mass % or more, preferably 1 mass % or more, more preferably 1.5 mass % or more, and for example, 25 mass % or less, preferably 22 mass % or less, more preferably 20 mass % or less, further preferably 15 mass % or less.

The above-described (A) xylylene group and/or hydrogenated xylylene group and the above-described (B) alkylene group having 2 to 6 carbon atoms improve gas barrier properties of the polyurethane layer 3. Furthermore, in the polyurethane layer 3 containing these, the polar group density tends to be high, and therefore improvement in interlayer adhesive strength between the polyurethane layer 3 and the metal vapor deposition layer 4 can be achieved.

(C) Polyalkylene oxide group is introduced into the polyurethane layer 3 by using, for example, the water dispersible polyisocyanate having a polyalkylene oxide group (described later) as materials of the polyurethane layer 3.

(C) Polyalkylene oxide group is introduced into the polyurethane layer 3 also by, for example, using the active hydrogen group-containing compound (described later) containing a polyalkylene oxide group (hydrophilic group (nonionic group)) as materials of the polyurethane layer 3.

(C) Polyalkylene oxide group is introduced into the polyurethane layer 3 by using preferably water dispersible polyisocyanate having a polyalkylene oxide group (described later), particularly preferably, water dispersible nonblocked polyisocyanate having a polyalkylene oxide group (described later).

For (C) polyalkylene oxide group, preferably, a polyalkylene oxide group having an alkylene oxide group with 2 to 3 carbon atoms as a repeating unit is used, to be specific, a polyethylene oxide group, a polypropylene oxide group, and a polyethylene oxide-polypropylene oxide copolymer (block/random) group are used.

The (C) polyalkylene oxide group content (total amount) is, when the polyurethane layer 3 as a whole is 100 mass %, for example, 0.5 mass % or more, preferably 1 mass % or more, and for example, 10 mass % or less, preferably 8 mass % or less, more preferably 7 mass % or less.

The above-described (C) polyalkylene oxide group improves interlayer adhesive strength between the substrate 2 and the polyurethane layer 3. In other words, when the polyurethane layer 3 does not contain the above-described (C) polyalkylene oxide group, it tends to cause decrease in interlayer adhesive strength between the substrate 2 and the polyurethane layer 3.

The above-described (C) polyalkylene oxide group has less effects on gas barrier properties, and therefore even if the polyurethane layer 3 contains the above-described (C) polyalkylene oxide group, it tends to not cause decrease in gas barrier properties. This is probably because the above-described (C) polyalkylene oxide group has relatively high compatibility with the above-described (A) xylylene group and/or hydrogenated xylylene group and the above-described (B) alkylene group having 2 to 6 carbon atoms contributing to gas barrier properties, and the above-described (C) polyalkylene oxide group is hardly partialized in the polyurethane layer 3.

(D) Alkylene group containing an ionic group and/or, arylene group containing an ionic group is preferably introduced, as necessary, into the polyurethane layer 3 by using, for example, mainly an active hydrogen group-containing compound (described later) containing an ionic group as a hydrophilic group as materials of the polyurethane layer 3.

When (D) alkylene group containing an ionic group, and/or, arylene group containing an ionic group are contained, the content (total amount) thereof is, when the polyurethane layer 3 as a whole is 100 mass %, for example, 1 mass % or more, preferably 1.5 mass % or more, more preferably 2 mass % or more, and for example, 25 mass % or less, preferably 20 mass % or less, more preferably 15 mass % or less, further preferably 10 mass % or less.

The above-described (D) alkylene group containing an ionic group, and/or, arylene group containing an ionic group improve particularly water solubility and dispersion, and therefore it is suitably contained in aqueous polyurethane resin (described later). Furthermore, the above-described (D) alkylene group containing an ionic group, and/or, arylene group containing an ionic group improve interlayer adhesive strength between the polyurethane layer 3 and the metal vapor deposition layer 4.

In (D) alkylene group containing an ionic group, and/or, arylene group containing an ionic group, the ionic group is, as necessary, neutralized, by a neutralizing agent, and is contained as a salt of the ionic group.

(E) At least one group selected from the group consisting of an alkylene group having an amino group, arylene group having an amino group, alkylene group having a thiol group, and arylene group having a thiol group is preferably introduced into the polyurethane layer 3 by, for example, using the chain extender (preferably, amino group-containing component (described later)) to be described later as materials of the polyurethane layer 3, as necessary.

When (E) at least one group selected from the group consisting of an alkylene group having an amino group, arylene group having an amino group, alkylene group having a thiol group, and arylene group having a thiol group is contained, the content thereof (total amount) is, when the polyurethane layer 3 as a whole is 100 mass %, for example, 1 mass % or more, preferably 1.5 mass % or more, more preferably 2 mass % or more, and for example, 25 mass % or less, preferably 20 mass % or less, more preferably 15 mass % or less, further preferably 10 mass % or less.

The above-described (E) alkylene group having an amino group, arylene group having an amino group, alkylene group having a thiol group, and arylene group having a thiol group can increase the molecular weight of the polyurethane resin.

The amount of the above-described (A) to (E) groups contained in the polyurethane layer 3 can be calculated from the structure of the material components and the ratio of the material components used, and can be measured by conducting hydrolysis of and analyzing the polyurethane layer 3.

Such a polyurethane layer 3 is a resin layer containing polyurethane resin, and preferably, is a resin layer composed of polyurethane resin. Preferably, the polyurethane layer 3 is produced by applying a coating liquid containing polyurethane dispersion and water dispersible polyisocyanate on the substrate 2 and drying, as a film layer.

The polyurethane dispersion is produced by, preferably, allowing polyurethane resin (aqueous polyurethane resin) to disperse in water.

The polyurethane resin contained in the polyurethane dispersion can be produced as a polyaddition product, for example, by allowing the polyisocyanate component to react with an active hydrogen group-containing component (e.g., polyol component such as diol having 2 to 6 carbon atoms (described later) to be described later, for example, an amino group-containing component (described later), etc.).

When the molecular weight of the polyaddition product hardly gets high in the reaction between the polyisocyanate component and the active hydrogen group-containing component, to produce polyurethane resin, preferably, first, the polyisocyanate component is allowed to react with the polyol component, to prepare an isocyanate group-terminated prepolymer, and then, the produced isocyanate group-terminated prepolymer is allowed to react with a chain extender.

To be more specific, in this method, first, the polyisocyanate component is allowed to react with the polyol component.

The polyisocyanate component contains, as an essential component, xylylene diisocyanate and/or hydrogenated xylylene diisocyanate.

Examples of xylylene diisocyanate (XDI) include structural isomers of 1,2-xylylene diisocyanate (o-XDI), 1,3-xylylene diisocyanate (m-XDI), and 1,4-xylylene diisocyanate (p-XDI).

These xylylenediisocyanates may be used singly or in combination of two or more. For the xylylenediisocyanate, preferably 1,3-xylylenediisocyanate and 1,4-xylylenediisocyanate are used, more preferably 1,3-xylylenediisocyanate is used.

Examples of the hydrogenated xylylene diisocyanate (also called: bis(isocyanatomethyl) cyclohexane)($H_6$XDI) include structural isomers of 1,2-hydrogenated xylylene diisocyanate (1,2-bis(isocyanatomethyl) cyclohexane, o-$H_6$XDI), 1,3-hydrogenated xylylene diisocyanate (1,3-bis(isocyanatomethyl) cyclohexane, m-$H_6$XDI), and 1,4-hydrogenated xylylene diisocyanate (1,4-bis(isocyanatomethyl) cyclohexane, p-$H_6$XDI).

These hydrogenated xylylene diisocyanates may be used singly or in combination of two or more. For the hydrogenated xylylene diisocyanate, preferably 1,3-hydrogenated xylylene diisocyanates and 1,4-hydrogenated xylylene diisocyanates are used, more preferably 1,3-hydrogenated xylylene diisocyanate is used.

Examples of xylylene diisocyanate and/or hydrogenated xylylene diisocyanate include their derivatives.

Examples of xylylene diisocyanate and/or hydrogenated xylylene diisocyanate derivatives include multimers (e.g., dimer, trimer (e.g., isocyanurate-modified product, iminooxadiazinedione-modified product), pentamer, heptamer, etc.) of xylylene diisocyanate and/or hydrogenated xylylene diisocyanate, allophanate-modified products (e.g., allophanate-modified product produced by reaction of xylylene diisocyanate and/or hydrogenated xylylene diisocyanate with a low-molecular-weight polyol to be described later, etc.), polyol modified products (e.g., polyol modified product (alcohol adduct) produced by reaction of xylylene diisocyanate and/or hydrogenated xylylene diisocyanate with a low-molecular-weight polyol to be described later, etc.), biuret-modified products (e.g., biuret-modified product produced by reaction of xylylene diisocyanate and/or hydrogenated xylylene diisocyanate with water or amines, etc.), urea-modified products (e.g., urea-modified product produced by reaction of xylylene diisocyanate and/or hydrogenated xylylene diisocyanate with diamine, etc.), oxadiazinetrione-modified products (e.g., oxadiazinetrione produced by reaction of xylylene diisocyanate and/or hydrogenated xylylene diisocyanate with carbon dioxide, etc.), carbodiimide-modified products (carbodiimide-modified product produced by decarboxylation condensation reaction of xylylene diisocyanate and/or hydrogenated xylylene diisocyanate, etc.), urethodione-modified products, and uretonimine-modified products.

These derivatives may be used singly or in combination of two or more.

In the polyisocyanate component, xylylene diisocyanate or hydrogenated xylylene diisocyanate can be used singly, or xylylene diisocyanate and hydrogenated xylylene diisocyanate can be used in combination. When xylylene diisocyanate and the hydrogenated xylylene diisocyanate are used in combination, the ratio of xylylene diisocyanate to hydrogenated xylylene diisocyanate (xylylene diisocyanate/hydrogenated xylylene diisocyanate (mass ratio)) is, for example, 99/1 to 1/99, preferably 90/10 to 10/90, more preferably 65/35 to 35/65.

The polyisocyanate component may contain, as necessary, other polyisocyanates.

Examples of the other polyisocyanates include polyisocyanates such as aromatic polyisocyanates, araliphatic polyisocyanates (excluding xylylene diisocyanate), aliphatic polyisocyanates, and alicyclic polyisocyanates (excluding hydrogenated xylylene diisocyanate).

Examples of the aromatic polyisocyanate include aromatic diisocyanates such as tolylene diisocyanate (2,4- or 2,6-tolylene diisocyanate or a mixture thereof)(TDI), phenylenediisocyanate (m-, p-phenylenediisocyanate or a mixture thereof), 4,4'-diphenvyl diisocyanate, 1,5-naphthalene diisocyanate (NDI), diphenylmethanediisocyanate (4,4'-, 2,4'- or 2,2'-diphenylmethanediisocvanate or a mixture thereof)(MDI), 4,4'-toluidine diisocyanate (TODI), and 4,4'-diphenylether diisocyanate.

Examples of the araliphatic polyisocyanate (excluding xylylene diisocyanate) include araliphatic diisocyanates such as tetramethylxylylene diisocyanate (1,3- or 1,4-tetramethylxylylene diisocyanate or a mixture thereof) (TMXDI), and ω,ω'-diisocyanate-1,4-diethylbenzene.

Examples of the aliphatic polyisocyanate include aliphatic diisocyanates such as trimethylenediisocyanate, 1,2-propylenediisocyanate, butylenediisocyanate (tetramethylenediisocyanate, 1,2-butylenediisocyanate, 2,3-butylenediisocyanate, and 1,3-butvlenediisocyanate), 1,5-pentamethylenediisocyanate (PDI), 1,6-hexamethylenediisocyanate (also called: hexamethylenediisocyanate)(HDI), 2,4,4- or 2,2,4-trimethvlhexamethylenediisocyanate, and 2,6-diisocyanatemethyl caproate.

Examples of the alicyclic polyisocyanate (excluding hydrogenated xylylene diisocyanate) include alicyclic diisocyanates such as 1,3-cyclopentane diisocyanate, 1,3-cyclopentene diisocyanate, cyclohexanediisocyanate (1,4-cyclohexanediisocyanate, 1,3-cyclohexanediisocyanate), 3-isocyanatomethyl-3,5,5-trimethylcyclohexyl isocyanate (also called: isophoron diisocyanate) (IPDI), methylenebis (cyclohexyl isocyanate)(also called: bis(isocyanatocyclohexvl) methane)(4,4'-, 2,4'- or 2,2'-methylenebis(cyclohexyl isocyanate), their Trans,Trans-isomer, Trans,Cis-isomer, Cis,Cis-isomer, or a mixture thereof) ($H_{12}$MDI), methylcyclohexanediisocyanate (methyl-2,4-cyclohexanediisocyanate, methyl-2,6-cyclohexanediisocyanate), and norbornanediisocyanate (various isomers or a mixture thereof) (NBDI). Preferably, 4,4'-methylenebis(cyclohexyl isocyanate) is used.

Examples of the other polyisocyanate include the above-described derivatives.

These examples of the other polyisocyanates may be used singly or in combination of two or more. Preferably, aliphatic polyisocyanates and alicyclic polyisocyanates are used, more preferably, alicyclic polyisocyanates are used, and further preferably, methylenebis(cyclohexyl isocyanate) is used.

When the other polyisocyanate (polyisocyanate excluding xylylene diisocyanate and hydrogenated xylylene diisocyanate) is blended, the xylylene diisocyanate content and the hydrogenated xylylene diisocyanate content (when they are used in combination, their total amount) relative to a total amount of the polyisocyanate component is, for example, 50 mass % or more, preferably 60 mass % or more, more preferably 80 mass % or more, and for example, 99 mass % or less.

When the other polyisocyanate (polyisocyanate excluding xylylene diisocyanate and hydrogenated xylylene diisocyanate) is blended, for the polyisocyanate component, preferably, xylylene diisocyanate and bis(isocyanatocyclohexyl) methane are used in combination.

By using xylylene diisocyanate and bis(isocyanatocyclohexyl) methane in combination, polyurethane dispersion that is excellently water dispersible and has a small average particle size can be produced without damaging gas barrier properties.

When xylylene diisocyanate and bis(isocyanatocyclohexyl) methane are used in combination, for example, 60 parts by mass or more, preferably 70 parts by mass or more, more preferably 80 parts by mass or more, and for example, 95 parts by mass or less, preferably 93 parts by mass or less, more preferably 90 parts by mass or less of xylylene diisocyanate is blended relative to 100 parts by mass of a total amount of xylylene diisocyanate and bis(isocyanatocyclohexyl) methane. And for example, 5 parts by mass or more, preferably 7 parts by mass or more, more preferably 10 parts by mass or more, and for example, 40 parts by mass or less, preferably 30 parts by mass or less, more preferably 20 parts by mass or less of bis(isocyanatocyclohexyl) methane is blended relative to 100 parts by mass of a total amount of xylylene diisocyanate and bis(isocyanatocyclohexyl) methane.

The polyol component contains, as an essential component, diol having 2 to 6 carbon atoms.

The diol having 2 to 6 carbon atoms is an organic compound having 2 to 6 carbon atoms, a number average molecular weight of 40 or more and less than 400, and two hydroxyl groups. To be specific, examples thereof include alkanediol having 2 to 6 carbon atoms (alkyleneglycol having 2 to 6 carbon atoms) such as ethylene glycol, propylene glycol, 1,3-propanediol, 1,4-butyleneglycol, 1,3-butyleneglycol, 1,2-butyleneglycol, 1,5-pentanediol, 1,6-hexanediol, neopentyl glycol, 3-methyl-1,5-pentanediol, and 1,3- or 1,4-cyclohexanediol; and etherdiol having 2 to 6 carbon atoms such as diethylene glycol, triethylene glycol, and dipropylene glycol; and alkenediol having 2 to 6 carbon atoms such as 1,4-dihydroxy-2-butene.

These diols having 2 to 6 carbon atoms may be used singly or in combination of two or more.

For the diol having 2 to 6 carbon atoms, preferably, alkanediol having 2 to 6 carbon atoms, more preferably, ethylene glycol is used.

The mixing ratio of the diol having 2 to 6 carbon atoms relative to 100 parts by mass of a total amount of the polyol component is, for example, 10 parts by mass or more, preferably 20 parts by mass or more, and for example, 70 parts by mass or less, preferably 65 parts by mass or less.

The polyol component preferably contains, as an optional component, an active hydrogen group-containing compound containing a hydrophilic group.

The active hydrogen group-containing compound containing a hydrophilic group is a compound containing a hydrophilic group such as a nonionic group or an ionic group and an active hydrogen group such as an amino group or a hydroxyl group, to be specific, for example, examples thereof include an active hydrogen group-containing compound containing a nonionic group and an active hydrogen group-containing compound containing an ionic group.

For the active hydrogen group-containing compound containing a nonionic group, for example, an active hydrogen group-containing compound containing a polyalkylene oxide group (polyoxyalkylene group) as a hydrophilic group (nonionic group) is used. To be more specific, examples of the active hydrogen group-containing compound containing a nonionic group include polyoxyethylene glycol, one-end-terminated polyoxyethylene glycol, and polyols containing polyoxyethylene side chain.

The polyol containing polyoxyethylene side chain is an organic compound containing a polyoxyethylene group in the side chain and having two or more hydroxyl groups, and can be synthesized as follows.

That is, first, the above-described diisocyanate and the one-end-terminated polyoxyethylene glycol (e.g., alkoxypolyoxyethylenemonol having its one-end-terminated with an alkyl group having 1 to 4 carbon atoms, number average molecular weight 200 to 6000, preferably 300 to 3000) is subjected to urethane-forming reaction at a ratio such that the isocyanate group of diisocyanate is in excess relative to the hydroxyl group of the one-end-terminated polyoxyethylene glycol, and as necessary unreacted diisocyanate is removed, thereby producing polyoxyethylene-chain containing monoisocyanate.

Then, the polyoxyethylene chain-containing monoisocyanate and dialkanolamine (e.g., diethanolamine, etc.) are subjected to urea-forming reaction at a ratio such that the isocyanate group of the polyoxyethylene group-containing monoisocyanate is substantially equal with the secondary amino group of dialkanolamine.

In the active hydrogen group-containing compound containing a nonionic group, the nonionic group, to be specific, polyoxyethylene group has a number average molecular weight of, for example, 600 to 6000.

For the diisocyanate for production of polyol containing polyoxyethylene side chain, preferably, aliphatic diisocyanate such as hexamethylenediisocyanate (HDI), and alicyclic diisocyanates such as 1.4- or 1,3-bis(isocyanatomethyl) cyclohexane ($H_6$XDI), 3-isocyanatomethyl-3,5,5-trimethylcyclohexyl isocyanate (also called: isophoron diisocyanateX) (IPDI), 4,4'-methylenebis(cyclohexyl isocyanate) ($H_{12}$MDI), and 2,6-bis(isocyanatomethyl) norbornane (NBDI) are used.

The active hydrogen group-containing compound containing an ionic group is an organic compound having a combination of, for example, an anionic group such as carboxylic acid or a cationic group such as quaternary amine, and an active hydrogen group such as two or more hydroxyl groups or amino groups, and preferably, an organic compound containing a combination of an anionic group and two or more hydroxyl groups, more preferably, an organic compound (active hydrogen group-containing compound containing a carboxy group (e.g., carboxy group-containing polyol, etc.)) containing carboxylic acid and two hydroxyl groups is used.

Examples of the carboxy group-containing polyol include polyhydroxy alkanoic acids such as 2,2-dimethylolacetic acid, 2,2-dimethylollactic acid, 2,2-dimethylolpropionic acid (also called: dimethylolpropionic acid), 2,2-dimethylolbutanoic acid, 2,2-dimethylolbutyric acid, and 2,2-dimethylol valeric acid, and preferably 2,2-dimethylolpropionic acid is used.

These active hydrogen group-containing compounds containing a hydrophilic group may be used singly or in combination. Preferably, an active hydrogen group-containing compound containing an ionic group, more preferably, carboxy group-containing polyol is used, even more preferably, polyhydroxy alkanoic acid is used.

Blending polyhydroxy alkanoic acid further improves, along with water dispersibility, gas barrier properties, adherence with the substrate, and transparency.

When the active hydrogen group-containing compound containing a hydrophilic group is used, the blending ratio of the active hydrogen group-containing compound containing a hydrophilic group is, relative to 100 parts by mass of the total amount of the polyol component, for example, 10 parts by mass or more, preferably 15 parts by mass or more, and for example, 40 parts by mass or less, preferably 30 parts by mass or less.

The polyol component can further contain, as an optional component, other low-molecular-weight polyols (low-molecular-weight polyol excluding diol having 2 to 6 carbon atoms and the active hydrogen group-containing compound containing a hydrophilic group) and high-molecular weight polyols.

Other low-molecular-weight polyols are an organic compound (excluding diol having 2 to 6 carbon atoms and an active hydrogen group-containing compound containing a hydrophilic group) having a number average molecular weight of 40 or more and less than 400, and two or more hydroxyl groups in one molecule, and examples thereof include diol having 7 or more carbon atoms (dihydric alcohol) and a low-molecular-weight polyol having a functionality of three or more.

Diol having 7 or more carbon atoms (dihydric alcohol) is an organic compound having a number average molecular weight of 40 or more and less than 400, two hydroxyl groups in one molecule, and 7 or more carbon atoms. Examples thereof include alkane-1,2-diol having 7 to 20 carbon atoms, 2,6-dimethyl-1-octene-3,8-diol, 1,3- or 1,4-cyclohexanedimethanol, a mixture thereof, hydrogenated bisphenol A, and bisphenol A.

Examples of the diol having 7 or more carbon atoms (dihydric alcohol) also include dihydric polyalkylene oxide having a number average molecular weight of less than 400. Such polyalkylene oxide can be produced as polyethylene glycol (polyoxyethyleneetherglycol), polypropylene glycol (polyoxypropyleneetherglycol), and polyethylene polypropylene glycol (random or block copolymer) by addition reaction of alkylene oxide such as ethylene oxide and/or propyleneoxide with the above-described dihydric alcohol as an initiator. Examples thereof also include polytetramethylene ether glycol having a number average molecular weight of less than 400 produced by ring-opening polymerization of tetrahydrofuran.

The low-molecular-weight polyol having a functionality of three or more is an organic compound having a number average molecular weight of 40 or more and less than 400 and having three or more hydroxyl groups in one molecule, and examples thereof include trihydric alcohols (low-molecular-weight triol) such as glycerin, 2-methyl-2-hydroxymethyl-1,3-propanediol, 2,4-dihydroxy-3-hydroxymethylpentane, 1,2,6-hexanetriol, trimethylolpropane, and 2,2-bis(hydroxymethyl)-3-butanol: tetrahydric alcohols such as tetramethylolmethane (pentaerythritol) and diglycerin; pentahydric alcohols such as xylitol; hexahydric alcohols such as sorbitol, mannitol, allitol, iditol, dulcitol, altritol, inositol, and dipentaerythritol: heptahydric alcohols such as perseitol; and octahydric alcohols such as sucrose.

Examples of the low-molecular-weight polyol having a functionality of three or more also include polyalkylene oxide having a functionality of three or more and a number average molecular weight of 40 or more and less than 400. Such polyalkylene oxide can be produced as polyethylenepolyol, polypropylenepolyol, and polyethylenepolypropylenepolyol (random or block copolymer) by addition reaction of alkylene oxide such as ethylene oxide and/or propyleneoxide with the above-described low-molecular-weight polyol having a functionality of three or more or a known polyamine as an initiator.

These low-molecular-weight polyols having a functionality of three or more may be used singly or in combination of two or more.

For the low-molecular-weight polyol having a functionality of three or more, preferably trihydric alcohol (low-molecular-weight triol) and tetrahydric alcohol are used, more preferably trihydric alcohol (low-molecular-weight triol) is used, even more preferably, trimethylolpropane and glycerin are used.

These other low-molecular-weight polyols (low-molecular-weight polyol excluding the above-described diol having 2 to 6 carbon atoms and active hydrogen group-containing compound containing a hydrophilic group) can be used singly, or can be used in combination of two or more.

When the other low-molecular-weight polyol (low-molecular-weight polyol excluding the above-described diol having 2 to 6 carbon atoms and active hydrogen group-containing compound containing a hydrophilic group) is blended, the content thereof relative to 100 parts by mass of the total amount of the polyol component is, for example, 50 parts by mass or less, preferably 40 parts by mass or less.

Preferably, a low-molecular-weight polyol having a functionality of three or more is used as the other low-molecular-weight polyol.

When the low-molecular-weight polyol having a functionality of three or more is used, diol having 2 to 6 carbon atoms and the low-molecular-weight polyol having a functionality of three or more are used in combination at the ratio of the following: relative to 100 parts by mass of a total of diol having 2 to 6 carbon atoms and the low-molecular-weight polyol having a functionality of three or more, for example, 2 parts by mass or more, preferably 5 parts by mass or more, and for example, 40 parts by mass or less, preferably 35 parts by mass or less of the low-molecular-weight polyol having a functionality of three or more is used.

The high-molecular weight polyol is an organic compound having two or more hydroxyl groups and a number average molecular weight of 400 or more, and examples thereof include polyetherpolyol (e.g., polyoxyalkylene polyol such as polypropylene glycol, polytetramethylene ether polyol, etc.), polyesterpolyol (e.g., adipic acid polyesterpolyol, phthalic acid polyesterpolyol, lactone-based polyester polyol, etc.), polycarbonatepolyol, polyurethane polyol (e.g., urethane-modified polyols produced by modifying polyetherpolyol, polyesterpolyol, polycarbonatepolyol with polyisocyanate), epoxy polyol, vegetable oil polyol, polyolefin polyol, acrylic polyol, and vinyl monomer-modified polyol.

These high molecular weight polyols may be used singly or in combination of two or more.

When the high-molecular weight polyol is blended, the blending ratio of the high-molecular weight polyol is, in view of gas barrier properties, relative to 100 parts by mass of the total amount of the polyol component, for example, 50 parts by mass or less, preferably 40 parts by mass or less, further preferably 30 parts by mass or less.

In view of gas barrier properties, the polyol component preferably does not contain the high-molecular weight polyol, more preferably, the polyol component consists of the above-described diol having 2 to 6 carbon atoms, the active hydrogen group-containing compound containing a hydrophilic group, and the low-molecular-weight polyol having a functionality of three or more, or consists of the above-described diol having 2 to 6 carbon atoms and the active hydrogen group-containing compound containing a hydrophilic group.

In the reaction between the polyisocyanate component and the polyol component, the above-described components are allowed to react by a known polymerization method such as bulk polymerization and solution polymerization, preferably, by solution polymerization with which adjustment of reactivity and viscosity is easier.

In this reaction, the equivalent ratio of the isocyanate group in the polyisocyanate component relative to the hydroxyl group in the polyol component (isocyanate group/hydroxyl group) is, for example, 1.2 or more, preferably 1.3 or more, and for example, 3.0 or less, preferably 2.5 or less.

In bulk polymerization, for example, the above-described components are blended under a nitrogen atmosphere, and allowed to react at a reaction temperature of 75 to 85° C. for about 1 to 20 hours.

In solution polymerization, for example, the above-described components are blended in an organic solvent (solvent) under a nitrogen atmosphere, and allowed to react at a reaction temperature of 20 to 80° C. for about 1 to 20 hours.

Examples of the organic solvent include those organic solvents that are inactive to isocyanate groups, and are highly hydrophilic, such as, for example, acetone, methyl ethyl ketone, ethyl acetate, tetrahydrofuran, acetonitrile, and N-methylpyrrolidone.

In the above-described polymerization, as necessary, for example, amine-based, tin-based, or lead-based reaction catalysts can be added, and unreacted polyisocyanate (including xylylene diisocyanate and/or hydrogenated xylylene diisocyanate) can be removed from the produced isocyanate group-terminated prepolymer, by a known method such as distillation and extraction.

In this manner, the isocyanate group-terminated prepolymer is produced.

When the isocyanate group-terminated prepolymer contains an ionic group, preferably, a neutralizing agent is added for neutralization to form a salt of the ionic group.

When the ionic group is an anionic group, examples of the neutralizing agent include a common use base, for example, organic bases (e.g., tertiary amines (trialkylamine having 1 to 4 carbon atoms such as trimethylamine and triethylamine, alkanolamines such as dimethylethanolamine, methyldiethanolamine, triethanolamine, and triisopropanolamine, and heterocyclic amines such as morpholine, etc.)), inorganic bases (ammonia, alkali metal hydroxide (lithium hydroxide, sodium hydroxide, potassium hydroxide, etc.), alkaline earth metal hydroxides (magnesium hydroxide, calcium hydroxide, etc.), and alkali metal carbonates (sodium carbonate, potassium carbonate, etc.)). These bases can be used alone or in combination of two or more.

The neutralizing agent is added, per 1 equivalent of anionic group, in an amount of 0.4 equivalent or more, preferably 0.6 equivalent or more, and for example, 1.2 equivalent or less, preferably 1 equivalent or less.

The thus produced isocyanate group-terminated prepolymer is a polyurethane prepolymer having at least one free isocyanate group at its molecular terminal, and the isocyanate group content (isocyanate group content based on the solid content excluding the solvent) is, for example, 0.3 mass % or more, preferably 0.5 mass % or more, more preferably 1.0 mass % or more, and for example, 15 mass % or less, preferably 12 mass % or less, more preferably 10 mass % or less.

The isocyanate group has an average functionality of, for example, 1.5 or more, preferably 1.9 or more, more preferably 2.0 or more, further preferably 2.1 or more, and for example, 3.0 or less, preferably 2.5 or less.

When the average functionality of the isocyanate group is within the above-described range, stable polyurethane dispersion can be obtained, and substrate adherence and gas barrier properties can be ensured.

The number average molecular weight (number average molecular weight determined by GPC measurement using standard polystyrene as the calibration curve) is, for example, 500 or more, preferably 800 or more, and for example, 10000 or less, preferably 5000 or less.

The isocyanate group-terminated prepolymer has a hydrophilic group concentration of, for example, 0.1 mmol/g or more, preferably 0.2 mmol/g or more, and for example, 1.2 mmol/g or less, preferably 1.0 mmol/g or less, more preferably 0.8 mmol/g or less.

When the isocyanate group-terminated prepolymer has a hydrophilic group concentration in the above-described range, stable dispersion of the above-described polyurethane can be produced.

Thereafter, in this method, the isocyanate group-terminated prepolymer produced as described above is allowed to react with the chain extender, for example, in water, to produce polyurethane dispersion of polyurethane resin.

That is, in the present invention, as described above, a chain extender is preferably used.

Examples of the chain extender include the above-described low-molecular-weight polyol (dihydric low-molecular-weight polyol, trihydric low-molecular-weight polyol, etc.), amino group-containing component, and thiol group-containing component.

Examples of the amino group-containing component include amino group-containing compounds such as aromatic polyamine, araliphatic polyamine, alicyclic polyamine, aliphatic polyamine, aminoalcohol, polyoxyethylene group-containing polyamine, alkoxysilyl compound having a primary amino group or a primary amino group and a secondary amino group, hydrazine or derivatives thereof.

Examples of the aromatic polyamine include 4,4'-diphenylmethanediamine and tolylenediamine.

Examples of the araliphatic polyamine include 1,3- or 1,4-xylylene diamine, or mixtures thereof.

Examples of the alicyclic polyamine include 3-aminomethyl-3,5,5-trimethylcyclohexylamine (also called: isophoronediamine), 4,4'-dicyclohexylmethanediamine, 2,5(2, 6)-bis(aminomethyl) bicyclo[2.2.1]heptane, 1,4-cyclohexanediamine, 1-amino-3-aminomethyl-3,5,5-trimethylcyclohexane, bis-(4-aminocyclohexyl) methane, diaminocyclohexane, 3,9-bis(3-aminopropyl)-2,4,8,10-tetraoxaspiro[5,5] undecane, 1,3- and 1,4-bis(aminomethyl) cyclohexane and mixtures thereof.

Examples of the aliphatic polyamine include ethylenediamine, propylene diamine, 1,3-propane diamine, 1,4-butanediamine, 1,5-pentanediamine, 1,6-hexamethylenediamine, diethylenetriamine, triethylenetetramine, tetraethylenepentamine, 1,2-diaminoethane, 1,2-diaminopropane, and 1,3-diaminopentane.

Examples of the amino alcohol include 2-((2-aminoethyl) amino) ethanol (also called: N-(2-aminoethyl) ethanolamine), and 2-((2-aminoethyl) amino)-1-methylpropanol (also called: N-(2-aminoethyl) isopropanolamine).

Examples of the polyoxyethylene group-containing polyamine include polyoxyalkylene etherdiamine such as polyoxyethylene etherdiamine. To be more specific, examples thereof include PEG#1000 diamine manufactured by NOF Corporation, Jeffamine ED-2003, EDR-148, and XTJ-512 manufactured by Huntsman Inc.

Examples of the alkoxysilyl compound having a primary amino group, or a primary amino group and a secondary amino group include an alkoxysilyl compound having a primary amino group such as γ-aminopropyltrimethoxysilane, γ-aminopropyltriethoxysilane, and N-phenyl-γ-aminopropyltrimethoxysilane; and an alkoxysilyl compound having a primary amino group and a secondary amino group such as N-β (aminoethyl) γ-aminopropyltrimethoxysilane (also called: N-2-(aminoethyl)-3-aminopropyltrimethoxysilane), N-β (aminoethyl) γ-aminopropyltriethoxysilane (also called: N-2-(aminoethyl)-3-aminopropyltriethoxysilane), N-β (aminoethyl) γ-aminopropylmethyldimethoxysilane (also called: N-2-(aminoethyl)-3-aminopropylmethyldimethoxysilane), and N-β (aminoethyl) γ-aminopropylmethyldiethoxysilane (also called: N-2-(aminoethyl)-3-aminopropylmethyldiethoxysilane).

Examples of the hydrazine or derivatives thereof include hydrazine (including hydrate), succinic acid dihydrazide, and adipic acid dihydrazide.

These amino group-containing components can be used singly, or can be used in combination of two or more.

Examples of the thiol group-containing component include aliphatic or alicyclic polythiol, and aromatic polythiol.

Examples of the aliphatic or alicyclic polythiol include 1,2-ethanedithiol, 1,1-propane dithiol, 1,2-propane dithiol, 1,3-propane dithiol, 2,2-propane dithiol, 1,6-hexanedithiol, 1,1-cyclohexanedithiol, 1,2-cyclohexanedithiol, 1,1-bis(mercaptomethyl) cyclohexane, and 1,2,3-propane trithiol.

Examples of the aromatic polythiol include 1,2-dimercaptobenzene, 1,3-dimercaptobenzene, 1,2-bis(mercaptomethyl) benzene, 1,3-bis(mercaptomethyl) benzene, and 1,4-bis(mercaptomethyl) benzene.

These thiol group-containing components can be used singly, or can be used in combination of two or more.

For the chain extender, preferably, an amino group-containing component is used, more preferably, aminoalcohol is used, further preferably 2-((2-aminoethyl) amino) ethanol (also called: N-(2-aminoethyl) ethanolamine) is used.

To allow the above-described isocyanate group-terminated prepolymer to react with the chain extender in water, for example, first, the isocyanate group-terminated prepolymer is added to water, thereby dispersing the isocyanate group-terminated prepolymer in water, and then, the chain extender is added thereto, thereby extending the chain of the isocyanate group-terminated prepolymer with the chain extender.

To disperse the isocyanate group-terminated prepolymer in water, the isocyanate group-terminated prepolymer is added to water under stirring at a ratio of 100 to 1000 parts by mass of water relative to 100 parts by mass of the isocyanate group-terminated prepolymer.

Thereafter, when the chain extender is used, the chain extender is dropped in the water in which the isocyanate group-terminated prepolymer is dispersed while stirring, so that the equivalent ratio of the active hydrogen group of the chain extender relative to the isocyanate group of the isocyanate group (amino group and hydroxyl group)-terminated prepolymer (active hydrogen group/isocyanate group) is, for example, 0.6 to 1.2.

The chain extender is allowed to react by, for example, dropping, and after completion of the dropping, with further stirring, the reaction is completed at, for example, normal temperature. The reaction time till the completion of the reaction is, for example, 0.1 hour or more, and for example, 10 hours or less.

In contrast to the above-described method, water can be added in the isocyanate group-terminated prepolymer to disperse the isocyanate group-terminated prepolymer in water, and then a chain extender is added to the mixture to extend the chains of the isocyanate group-terminated prepolymer with the chain extender.

In this method, as necessary, the organic solvent and water can be removed, and furthermore, water can be added to adjust the solid content concentration.

The produced polyurethane dispersion of polyurethane resin has a solid content concentration of, for example, 10 mass % or more, preferably 15 mass % or more, more preferably 20 mass % or more, and for example, 60 mass % or less, preferably 50 mass % or less, more preferably 45 mass % or less.

The polyurethane dispersion has a pH of, for example, 5 or more, preferably 6 or more, and for example, 11 or less, preferably 10 or less.

The polyurethane dispersion has a viscosity at 25° C. of, for example, 3 mPa·s or more, preferably 5 mPa·s or more, and for example, 2000 mPa·s or less, preferably 1000 mPa·s or less.

The polyurethane dispersion has an average particle size of, for example, 10 nm or more, preferably 20 nm or more, and for example, 500 nm or less, preferably 300 nm or less.

The total of the urethane group concentration and urea group concentration of the polyurethane resin in the polyurethane dispersion is, for example, 25 mass % or more, preferably 30 mass % or more, more preferably 33 mass % or more, and for example, 50 mass % or less, preferably 47 mass % or less, more preferably 45 mass % or less.

The total of the urethane group concentration and urea group concentration can be calculated from the ratio of the material components charged.

The polyurethane resin in the polyurethane dispersion has an acid value of, for example, 12 mgKOH/g or more, preferably 15 mgKOH/g or more, and for example, 40 mgKOH/g or less, preferably 35 mgKOH/g or less.

The polyurethane resin in the polyurethane dispersion has a number average molecular weight (number average molecular weight determined by GPC using a calibration curve of standard polystyrene) of, for example, 1000 or more, preferably 3000 or more, and for example, 1000000 or less, preferably 100000 or less.

Furthermore, as necessary, various additives can be blended. Examples of the additive include silane coupling agents, alkoxysilane compounds, stabilizers (antioxidants, heat stabilizers, ultraviolet ray absorbents, etc.), plasticizers, antistatic agents, lubricants, anti-blocking agents, surfactants, dispersion stabilizers, coloring agents (pigments, dyes, etc.), fillers, colloidal silica, inorganic particles, inorganic oxide particles, and crystal nucleating agents.

The additives can be blended in advance in the above-described material components, and can be blended in the synthesized isocyanate group-terminated prepolymer or the polyurethane resin, and furthermore, can be blended when the components are blended simultaneously.

The blending ratio of the additives is not particularly limited, and is set suitably in accordance with purpose and application.

As necessary, a thermoplastic resin having gas barrier properties can be blended with the polyurethane dispersion to an extent that does not damage gas barrier properties.

Examples of the thermoplastic resin having gas barrier properties include polyvinyl alcohol, an ethylene-vinyl alcohol copolymer, a polyvinylidene chloride or vinylidene chloride copolymer, starch, and polysaccharides such as cellulose.

Examples of the water dispersible polyisocyanate preferably used in the present invention include the above-described polyisocyanate having a polyalkylene oxide group with the alkylene oxide group having 2 to 3 carbon atoms as a repeating unit. To be specific, for the water dispersible polyisocyanate, for example, water dispersible blocked polyisocyanate and water dispersible nonblocked polyisocyanate are used, preferably, water dispersible nonblocked polyisocyanate is used, more preferably, the water dispersible nonblocked polyisocyanate having a polyalkylene oxide group is used.

The water dispersible nonblocked polyisocyanate can be produced by dispersing, for example, polyisocyanate containing a hydrophilic group such as a polyethylene oxide group in water with a known dispersing agent (ionic dispersing agent, nonionic dispersing agent, etc.).

Examples of the polyisocyanate forming the water dispersible polyisocyanate include the polyisocyanates given as examples of the above-described polyisocyanate component. To be specific, examples include the above-described aromatic polyisocyanates, the above-described araliphatic polyisocyanates (including xylylene diisocyanate), the aliphatic polyisocyanates, the alicyclic polyisocyanates (including hydrogenated xylylene diisocyanate), and derivatives thereof.

When the aromatic polyisocyanate and the alicyclic polyisocyanates are used as the polyisocyanate forming the water dispersible polyisocyanate, the water dispersible polyisocyanate may have to contain (A) xylylene group and/or hydrogenated xylylene group.

In such a case, (A) xylylene group and/or hydrogenated xylylene group in the polyurethane layer 3 include (A) xylylene group and/or hydrogenated xylylene group derived from water dispersible polyisocyanate.

When the aliphatic polyisocyanate is used as the polyisocyanate forming the water dispersible polyisocyanate, the water dispersible polyisocyanate may include (B) alkylene group having 2 to 6 carbon atoms. In such a case, (B) alkylene group having 2 to 6 carbon atoms in the polyurethane layer 3 include (B) alkylene group having 2 to 6 carbon atoms derived from water dispersible polyisocyanate.

The water dispersible polyisocyanate can be used singly, or can be used in combination of two or more.

The water dispersible polyisocyanate can be obtained as a commercially available product. To be specific, TAKENATE WD-720, TAKENATE WD-725, TAKENATE WD-220. TAKENATE XWD-HS7, and TAKENATE XWD-HS 30 (manufactured by Mitsui Chemicals, Inc.): AQUANATE 100. AQUANATE 110, AQUANATE 200, and AQUANATE 210 (manufactured by Nippon Polyurethane Industry Co., Ltd.); DURANATE WB 40-100 and DURANATE WT 20-100 (manufactured by Asahi Kasei Chemicals Corporation); Bayhydur 3100 and Bayhydur XP2487/1 (manufactured by Bayer MaterialScience): and Basonat HW 100 and Basonat HA 100 (manufactured by BASF) are used.

By blending the above-described polyurethane dispersion and the above-described water dispersible polyisocyanate, a coating liquid is produced.

In the coating liquid, the polyurethane dispersion is blended with the water dispersible polyisocyanate such that the mass ratio (resin component in polyurethane dispersion/resin component in water dispersible polyisocyanate) of the resin component in polyurethane dispersion (solid content) relative to the resin component in water dispersible polyisocyanate (solid content) is, for example, 0.5/1 or more, preferably 1/1 or more, more preferably 2/1 or more, and for example, 99/1 or less, preferably 50/1 or less, more preferably 20/1 or less.

When the polyurethane dispersion is blended with the water dispersible polyisocyanate in the above-described range, adherence and gas barrier properties can be improved.

As necessary, water can be removed from the coating liquid, and furthermore, water can be added to adjust the solid content concentration.

To the coating liquid, to impart wettability relative to the substrate, and for dilution, for example, a water-soluble organic solvent can be added.

For the water-soluble organic solvent, for example, alcohols and ketones are used.

Examples of the alcohols include monol and glycol.

Examples of the monol include methanol, ethanol, 1-propanol, 2-propanol, isopropanol, butanol, 2-ethylhexylalcohol, other alkanol (C 5 to 38) and aliphatic unsaturated alcohol (C 9 to 24), alkenyl alcohol, 2-propen-1-ol, alkadienol (C 6 to 8), and 3,7-dimethyl-1,6-octadiene-3-ol.

These monols may be used singly or in a combination of two or more.

Examples of the glycol include ethylene glycol, propylene glycol, glycerin, diethylene glycol, and dipropylene glycol.

These glycols can be used singly, or can be used in combination of two or more.

Examples of the ketones include acetone and methyl ethyl ketone.

These ketones can be used singly, or can be used in combination of two or more.

For the water-soluble organic solvent, preferably, monol is used, and more preferably, 2-propanol is used.

The blending ratio of the water-soluble organic solvent is, relative to 100 parts by mass of the coating liquid, for example, 1 part by mass or more, preferably 2 parts by mass or more, and for example, 50 parts by mass or less, preferably 35 parts by mass or less.

For the coating liquid, as necessary, various additives can be blended. Examples of the additive include a silane coupling agent, alkoxysilane compound, stabilizer (antioxidant, heat stabilizer, ultraviolet ray absorbent, etc.), plasticizer, antistatic agent, lubricant, anti-blocking agent, surfactant, dispersion stabilizer, coloring agent (pigment, dye, etc.), filler, colloidal silica, inorganic particles, inorganic oxide particles, and crystal nucleating agent.

The amount of these additives to be added is suitably set in accordance with purpose and use.

The coating liquid has a solid content concentration of: for example, 0.5 mass % or more, preferably 1 mass % or more, and for example, 30 mass % or less, preferably 25 mass % or less.

The coating liquid can be applied, without particular limitation, by a known coating method such as, for example, a gravure coating method, reverse coating method, roll coating method, bar coating method, spray coating method, air knife coating method, and dipping method.

The drying conditions are as follows: the drying temperature is, for example, 35° C. or more, preferably 40° C. or more, and for example, 180° C. or less, preferably 160° C. or less; and the drying time is, for example, 0.1 minutes or more, preferably 0.2 minutes or more, and for example, 10 minutes or less, preferably 5 minutes or less.

In this manner, a polyurethane layer 3 composed of the polyurethane resin can be formed (laminated) on the substrate 2.

The polyurethane layer 3 can be aged, as necessary, for example, at 20 to 60° C., for about 2 to for 5 days.

To improve gas barrier properties, the coating liquid can be blended with a layered inorganic compound to disperse the layered inorganic compound in the polyurethane layer 3.

To be specific, for example, by applying the mixture of the above-described polyurethane dispersion and the layered inorganic compound on the substrate 2 and drying, a polyurethane layer 3 in which the layered inorganic compound is dispersed can be formed.

Examples of the layered inorganic compound include a swellable layered inorganic compound and a non-swellable layered inorganic compound. In view of gas barrier properties, preferably, the swellable layered inorganic compound is used.

The swellable layered inorganic compound is composed of extremely thin crystal units, and is a clay mineral having characteristics of coordinating or absorbing and swelling the solvent between its crystal unit layers.

Examples of the swellable layered inorganic compound include, to be specific, for example, water-containing silicate (phyllosilicate mineral, etc.), for example, kaolinite clay minerals (halloysite, kaolinite, endellite, Dickite, nakhlite, etc.), antigorite clay minerals (antigorite, chrysotile, etc.), smectite clay minerals (montmorillonite, beidellite, nontronite, saponite, hectorite, sauconite, stevensite, etc.), vermiculite clay minerals (vermiculite, etc.), mica or mica clay minerals (micas such as muscovite and phlogopite, margarite, tetrasilylic mica, Taeniolite, etc.), and synthetic mica.

These swellable layered inorganic compounds may be a natural clay mineral or may be a synthetic clay mineral. These swellable layered inorganic compounds can be used singly, or can be used in combination of two or more, and preferably, smectite clay minerals (montmorillonite, etc.), mica clay minerals (water swellable mica, etc.), synthetic mica are used, and more preferably, synthetic mica is used.

The layered inorganic compound has an average particle size of, for example, 50 nm or more, preferably 100 nm or more, and usually 100 μm or less, for example, 75 μm or less, preferably 50 m or less. The layered inorganic compound has an aspect ratio of for example, 10 or more, preferably 20 or more, more preferably 100 or more, and for example, 5000 or less, preferably 4000 or less, more preferably 3000 or less.

To form the polyurethane layer 3 in which the layered inorganic compound is dispersed, for example, first, the above-described polyurethane dispersion, the above-described water dispersible polyisocyanate, and the above-described layered inorganic compound are mixed to prepare a mixture of hybrid coating liquid. Then, the produced hybrid coating liquid is applied on the substrate 2, and dried.

To prepare the mixture (hybrid coating liquid), first, the layered inorganic compound is dispersed in water, and then the polyurethane dispersion and the water dispersible polyisocyanate are added to the dispersion liquid.

The blending ratio of the layered inorganic compound is set suitably in accordance with purpose and use.

In the mixture (hybrid coating liquid), the layered inorganic compound may sometimes undergo secondary aggregation, and therefore preferably, the layered inorganic compound is dispersed or mixed in the solvent, and thereafter dispersion is caused by using a mechanical and forceful dispersion treatment which involves shearing force, for example, by a homomixer, a colloid mill, a jet mill, a kneader, a bead mill, a sand mill, a ball mill, a three roll mill, and an ultrasonic dispersion device.

The method of applying the hybrid coating liquid is not particularly limited, and the above-described known coating method can be used.

The drying conditions are as follows: the drying temperature is, for example, 35° C. or more, preferably 40° C. or more, and for example, 180° C. or less, preferably 160° C. or less: and the drying time is, for example, 0.1 minutes or more, preferably 0.2 minutes or more, and for example, 10 minutes or less, preferably 5 minutes or less.

In this manner, the polyurethane layer 3 composed of the polyurethane resin and the layered inorganic compound can be formed on the substrate 2.

The polyurethane layer 3 has a thickness of, as a lamination amount of the polyurethane resin (after drying), for example, 0.05 g/m$^2$ or more, preferably 0.1 g/m$^2$ or more, more preferably 0.2 g/m$^2$ or more, and for example, 10 g/m$^2$ or less, preferably 7 g/m$^2$ or less, more preferably 5 g/m$^2$ or less, further preferably 3 g/m$^2$ or less.

The metal vapor deposition layer 4 is formed by vapor depositing a metal on the polyurethane layer 3.

Examples of the metal include metals of group 2 of the periodic table such as magnesium, calcium, and barium, metals of group 4 of the periodic table such as titanium and zirconium, metals of group 13 of the periodic table such as aluminum and indium, and metals of group 14 of the periodic table such as silicon, germanium, and tin; aluminum, aluminum oxide, magnesium oxide, titanium oxide, aluminum oxide, indium oxide, silicon oxide, silicon nitride, cerium oxide, calcium oxide, tin oxide, diamond-like carbon film, or a mixture thereof.

These metals can be used singly, or can be used in combination of two or more.

For the metal, in view of gas barrier properties and ease in production, preferably, aluminum, silicon, and their oxides are used, more preferably, aluminum and oxide thereof are used, further preferably, aluminum is used. In other words, for the metal vapor deposition layer 4, preferably, an aluminum layer is used. The metal vapor deposition layer 4 may change into oxide over time depending on conditions.

Examples of the method for forming the metal vapor deposition layer 4 include a method such as, for example, vacuum process.

Examples of the vacuum process include, without particular limitation, for example, vacuum deposition, sputtering, ion plating, and chemical vapor deposition (CVD), and preferably, in the vacuum deposition, a vacuum deposition device uses, for a heating method, preferably, an electron beam heating method, resistance heating method, and induction heating method.

The thickness of the metal vapor deposition layer 4 is suitably set in accordance with the kind of the metal, but the thickness of the metal vapor deposition layer 4 is, for example, 1 to 500 nm, preferably 5 to 200 nm, more preferably 10 to 100 nm.

The thus produced laminate film 1 has a thickness of, for example, 5 m or more, preferably 10 μm or more, and for example, 1 mm or less, preferably 0.5 mm or less.

In the above-described laminate film 1, the substrate 2/polyurethane layer 3/metal vapor deposition layer 4 are formed in this order, the substrate 2 is a polyolefin film, and the polyurethane layer 3 contains the above-described specific groups at a particular ratio.

The polyurethane layer 3 tends to have polar groups at a high density, as described above. Therefore, the laminate film 1 has excellent adhesive strength at interlayer of the substrate 2, polyurethane layer 3, and metal vapor deposition layer 4.

In the above-described laminate film 1, the polyurethane layer 3 is formed, and therefore the following can be considered: generation of pinholes in the metal vapor deposition layer 4 is expected to be suppressed, and as a result, gas barrier properties of the metal vapor deposition layer 4 can be effectively exhibited. Furthermore, the polyurethane layer 3 itself has excellent gas barrier properties.

Such a laminate film 1 includes, preferably, a polyurethane layer 3 between the substrate composed of a heat sealable plastic film 2 and the metal vapor deposition layer 4.

In such a laminate film 1, the polyurethane layer 3 is produced, particularly preferably, by the following: a coating liquid is applied on the substrate 2 and dried; the coating liquid contains polyurethane dispersion and water dispersible polyisocyanate; the polyurethane dispersion contains polyurethane resin produced by reaction of an isocyanate group-terminated prepolymer and a chain extender; and the isocyanate group-terminated prepolymer is produced by reaction of a polyisocyanate component including xylylene diisocyanate and/or hydrogenated xylylene diisocyanates and a polyol component including diol having 2 to 6 carbon atoms and an active hydrogen group-containing compound containing a hydrophilic group.

With such a production method of the laminate film 1, the above-described laminate film 1 can be produced efficiently.

The above-described laminate film 1 has excellent gas barrier properties.

The laminate film 1 has an oxygen transmittance of, for example, 4 cc/m$^2$/day/atm or less, preferably 3 cc/m$^2$/day/atm or less, more preferably 2.5 cc/m$^2$/day/atm or less, further preferably 2.0 cc/m$^2$/day/atm or less.

The laminate film 1 tends to have not only gas barrier properties, but also excellent interlayer adherence between the substrate 2, polyurethane layer 3, and metal vapor deposition layer 4. That is, the laminate film 1 tends to have excellent adherence (adhesive strength) between each layers from the substrate 2 to the metal vapor deposition layer 4, which allows for stable laminate.

Therefore, the laminate film 1 is suitably used in packaging materials that require gas barrier properties, to be specific, packaging materials for pharmaceutical products, food packaging materials, optical films, and industrial films, in particular, suitably used as a food packaging material.

Such a food packaging material includes the above-described laminate film, and therefore tends to form a laminate with excellent interlayer adherence between each layers of the substrate 2, polyurethane layer 3, and metal vapor deposition layer 4 and with stability, and furthermore, adherence (adhesive strength) from the substrate 2 to the metal vapor deposition layer 4 is excellent, and gas barrier properties are excellent.

Therefore, the above-described laminate film 1 and food packaging material are a suitable material that solves the problem of the present invention. Therefore, industrial significance of the present invention is great.

EXAMPLES

In the following, the present invention is described based on Examples and Comparative Examples, but the present invention is not limited to Examples below. "Parts" and "%" are based on mass unless otherwise specified in the following. The specific numeral values such as blending ratios (content), physical property values, and parameters used in the description below can be replaced with the upper limit value (numeral values defined with "or less" or "less than") or the lower limit value (numeral values defined with "or more", "more than") of the corresponding blending ratios (content), physical property values, and parameters used in DESCRIPTION OF EMBODIMENTS.

Synthesis Example 1 (Synthesis of Polyurethane Dispersion 1 (PUD 1))

143.2 g of TAKENATE 500 (1,3-xylylene diisocyanate, m-XDI, manufactured by Mitsui Chemicals, Inc.), 25.0 g of VestanatH$_{12}$MDI (4,4'-methylenebis(cyclohexyl isocyanate). H$_{12}$MDI, manufactured by Evonic Corporation), 29.2 g of ethylene glycol, 2.7 g of trimethylolpropane, 14.8 g of dimethylolpropionic acid, and 121.6 g of methyl ethyl ketone as a solvent were mixed, and reaction was conducted in a nitrogen atmosphere at 65 to 70° C. until the NCO % was 6.11% or less, thereby producing a transparent isocyanate group-terminated prepolymer reaction solution.

Then, the produced reaction solution was cooled to 40° C., and thereafter, neutralized with 11.0 g of triethylamine.

Then, the reaction solution was dispersed in 838.0 g of ion-exchange water with a homodisper, and an aqueous amine solution in which 24.2 g of 2-((2-aminoethyl) amino) ethanol was dissolved in 48.4 g of ion-exchange water was added thereto, thereby causing chain extension reaction.

Thereafter, aging reaction was performed for 1 hour, methyl ethyl ketone and ion-exchange water were distilled off with an evaporator, and ion-exchange water was used to adjust the solid content to 25 mass %, thereby producing polyurethane dispersion 1 (PUD 1).

The produced PUD 1 had a pH of 8.6, a viscosity of 15mPa·s (25° C.), and an average particle size of 60 nm measured by Coulter counter N5 (manufactured by Beckman Coulter, Inc.). The total of the urethane group concentration and the urea group concentration calculated by the amounts charged was 39.6 mass %.

Synthesis Example 2 (Synthesis of Polyurethane Dispersion 2 (PUD 2))

54.2 g of TAKENATE 500 (1,3-xylylene diisocyanate, m-XDI, manufactured by Mitsui Chemicals, Inc.), 111.9 g of TAKENATE 600 (1,3-bis(isocyanatomethyl) cyclohexane, H$_6$XDI, manufactured by Mitsui Chemicals, Inc.), 28.7 g of ethylene glycol, 1.9 g of glycerin, 16.6 g of dimethylolpropionic acid, and 96.7 g of methyl ethyl ketone as a solvent were mixed, and reaction was conducted in a nitrogen atmosphere at 65 to 70° C. until the NCO % was 6.70% or less, thereby producing a transparent isocyanate group-terminated prepolymer reaction solution.

Then, the produced reaction solution was cooled to 40° C., and thereafter, neutralized with 12.4 g of triethylamine.

Then, the reaction solution was dispersed in 837.5 g of ion-exchange water with a homodisper, and an aqueous amine solution in which 24.4 g of 2-((2-aminoethyl) amino) ethanol was dissolved in 48.9 g of ion-exchange water was added thereto, thereby causing chain extension reaction.

Thereafter, aging reaction was performed for 1 hour, methyl ethyl ketone and ion-exchange water were distilled off with an evaporator, and ion-exchange water was used to adjust the solid content to 25 mass %, thereby producing polyurethane dispersion 2 (PUD 2).

The produced PUD 2 had a pH of 8.8, a viscosity of 15mPa·s (25° C.), and an average particle size of 42 nm measured by Coulter counter N5 (manufactured by Beckman Coulter, Inc.). The total of the urethane group concentration and the urea group concentration calculated by the amounts charged was 40.0 mass %.

Synthesis Example 3 (Synthesis of Polyurethane Dispersion 3 (PUD 3))

112.1 g of TAKENATE 500 (1,3-xylylene diisocyanate, m-XDI, manufactured by Mitsui Chemicals, Inc.), 19.5 g of VestanatH$_{12}$MDI (4,4'-methylenebis(cyclohexyl isocyanate), H$_{12}$MDI, manufactured by Evonic Corporation), 11.9 g of ethylene glycol, 2.1 g of trimethylolpropane, 57.4 g of DIOL 400 (polypropylene glycol, number average molecular weight 400, manufactured by Mitsui Chemicals, Inc.), 16.1 g of dimethylolpropionic acid, and 113.8 g of methyl ethyl ketone as a solvent were mixed, and reaction was conducted in a nitrogen atmosphere at 65 to 70° C. until the NCO % was 4.83% or less, thereby producing a transparent isocyanate group-terminated prepolymer reaction solution.

Then, the produced reaction solution was cooled to 40° C., and thereafter, neutralized with 12.0 g of triethylamine.

Then, the reaction solution was dispersed in 848.5 g of ion-exchange water with a homodisper, and an aqueous amine solution in which 18.9 g of 2-((2-aminoethyl) amino) ethanol was dissolved in 37.9 g of ion-exchange water was added thereto, thereby causing chain extension reaction.

Thereafter, aging reaction was performed for 1 hour, methyl ethyl ketone and ion-exchange water were distilled off with an evaporator, and ion-exchange water was used to adjust the solid content to 25 mass %, thereby producing polyurethane dispersion 3 (PUD 3).

The produced PUD 3 had a pH of 8.7, a viscosity of 11 mPa·s (25° C.), and an average particle size of 65 nm measured by Coulter counter N5 (manufactured by Beckman Coulter, Inc.). The total of the urethane group concentration and the urea group concentration calculated by the amounts charged was 31.0 mass %.

Synthesis Example 4 (Synthesis of Polyurethane Dispersion 4 (PUD 4))

143.9 g of TAKENATE 500 (1,3-xylylene diisocyanate, m-XDI, manufactured by Mitsui Chemicals, Inc.), 25.1 g of VestanatH12MDI (4,4'-methylenebis(cyclohexyl isocyanate), H$_{12}$MDI, manufactured by Evonic Corporation), 28.6 g of ethylene glycol, 5.5 g of trimethylolpropane, 12.4 g of dimethylolpropionic acid, and 120.9 g of methyl ethyl ketone as a solvent were mixed, and reaction was conducted in a nitrogen atmosphere at 65 to 70° C. until the NCO % was 6.14% or less, thereby producing a transparent isocyanate group-terminated prepolymer reaction solution.

Then, the produced reaction solution was cooled to 40° C., and thereafter, neutralized with 9.2 g of triethylamine.

Then, the reaction solution was dispersed in 839.7 g of ion-exchange water with a homodisper, and an aqueous amine solution in which 23.3 g of 2-((2-aminoethyl) amino) ethanol was dissolved in 46.7 g of ion-exchange water was added thereto.

Then, 2.1 g of N-2-aminoethyl)-3-aminopropyltrimethoxysilane (trade name, KBM-603, manufactured by Shin-Etsu Chemical Co., Ltd.) was added, thereby causing chain extension reaction.

Thereafter, aging reaction was performed for 1 hour, methyl ethyl ketone and ion-exchange water were distilled off with an evaporator, and ion-exchange water was used to adjust the solid content to 25 mass %, thereby producing polyurethane dispersion 4 (PUD 4).

The produced PUD 4 had a pH of 8.6, a viscosity of 14mPa·s (25° C.), and an average particle size of 55 nm measured by Coulter counter N5 (manufactured by Beckman Coulter, Inc.). The total of the urethane group concentration and the urea group concentration calculated by the amounts charged was 39.8 mass %.

Synthesis Example 5 (Synthesis of Polyurethane Dispersion 5 (PUD 5))

98.1 g of TAKENATE 500 (1,3-xylylene diisocyanate, m-XDI, manufactured by Mitsui Chemicals, Inc.), 67.5 g of TAKENATE 600(1,3-bis(isocyanatomethyl) cyclohexane, H$_6$XDI, manufactured by Mitsui Chemicals, Inc.), 30.8 g of ethylene glycol, 16.7 g of dimethylolpropionic acid, and 121.4 g of methyl ethyl ketone as a solvent were mixed, and reaction was conducted in a nitrogen atmosphere at 65 to 70° C. until the NCO % was 6.24% or less, thereby producing a transparent isocyanate group-terminated prepolymer reaction solution.

Then, the produced reaction solution was cooled to 40° C., and thereafter, neutralized with 12.4 g of triethylamine.

Then, the reaction solution was dispersed in 837.2 g of ion-exchange water with a homodisper, and an aqueous amine solution in which 24.6 g of 2-((2-aminoethyl) amino) ethanol was dissolved in 49.1 g of ion-exchange water was added thereto, thereby causing chain extension reaction.

Thereafter, aging reaction was performed for 1 hour, methyl ethyl ketone and ion-exchange water were distilled off with an evaporator, and ion-exchange water was used to adjust the solid content to 25 mass %, thereby producing polyurethane dispersion 5 (PUD 5).

The produced PUD 5 had a pH of 8.6, a viscosity of 15 mPa·s (25° C.), and an average particle size of 62 nm measured by Coulter counter N5 (manufactured by Beckman Coulter, Inc.). The total of the urethane group concentration and the urea group concentration calculated by the amounts charged was 40.2 mass %.

Synthesis Example 6 (Synthesis of Polyurethane Dispersion 6 (PUD 6))

67.7 g of Vestanat IPDI (3-isocyanatomethyl-3,5,5-trimethylcyclohexyl isocyanate, IPDI, manufactured by Evonic Corporation), 146.6 g of TAKELAC U-5620 (polyester-polyol having a number average molecular weight of 2000, manufactured by Mitsui Chemicals, Inc.), 5.5 g of triethylene glycol, 10.8 g of dimethylolpropionic acid, and 79.6 g of acetonitrile as a solvent were mixed, and 0.03 g of tin octylate (Stanoct, manufactured by API Corporation) was added as a catalyst, and reaction was conducted in a nitrogen atmosphere at 65 to 70° C. until the NCO % was 3.10% or less, thereby producing a transparent isocyanate group-terminated prepolymer reaction solution.

Then, the produced reaction solution was cooled to 40° C., and thereafter, neutralized with 8.1 g of triethylamine.

Then, the reaction solution was dispersed in 863.7 g of ion-exchange water with a homodisper, and an aqueous amine solution in which 11.3 g of 2-(2-aminoethyl) amino) ethanol was dissolved in 22.6 g of ion-exchange water was added thereto, thereby causing chain extension reaction.

Thereafter, aging reaction was performed for 1 hour, acetonitrile and ion-exchange water were distilled off with an evaporator, and ion-exchange water was used to adjust the solid content to 25 mass %, thereby producing polyurethane dispersion 6 (PUD 6).

The produced PUD 6 had a pH of 7.8, a viscosity of 18 mPa·s (25° C.), and an average particle size of 50 nm measured by Coulter counter N5 (manufactured by Beckman Coulter, Inc.). The total of the urethane group concentration and the urea group concentration calculated by the amounts charged was 14.0 mass %.

The blending formulation in Synthesis Examples is shown in Table 1.

TABLE 1

| | | No. | | | | | |
|---|---|---|---|---|---|---|---|
| | | Synthesis Ex. 1 | Synthesis Ex. 2 | Synthesis Ex. 3 | Synthesis Ex. 4 | Synthesis Ex. 5 | Synthesis Ex. 6 |
| Blending formulation (parts by mass) | Polyurethane dispersion | PUD1 | PUD2 | PUD3 | PUD4 | PUD5 | PUD6 |
| | Polyisocyanate component | | | | | | |
| | m-XDI | 143.2 | 54.2 | 112.1 | 143.9 | 98.1 | — |
| | H6XDI | — | 111.9 | — | — | 67.5 | — |
| | H12MDI | 25.0 | — | 19.5 | 25.1 | — | — |
| | IPDI | — | — | — | — | — | 67.7 |
| | Polyol component | | | | | | |
| | Ethylene glycol | 29.2 | 28.7 | 11.9 | 28.6 | 30.8 | — |
| | Trimethylolpropane | 2.7 | — | 2.1 | 5.5 | — | — |
| | Glycerine | — | 1.9 | — | — | — | — |
| | PPG400 | — | — | 57.4 | — | — | — |
| | U-5620 | — | — | — | — | — | 146.6 |
| | Triethylene glycol | — | — | — | — | — | 5.5 |
| | Dimethylolpropionic acid | 14.8 | 16.6 | 16.1 | 12.4 | 16.7 | 10.8 |
| | Organic solvent | | | | | | |
| | MEK | 121.6 | 96.7 | 113.8 | 120.9 | 121.4 | |
| | Acetonitrile | — | — | — | — | — | 79.6 |
| | NCO % of isocyanate group-terminated prepolymer (mass %) | 6.11 | 6.70 | 4.83 | 6.14 | 6.24 | 3.10 |
| | Neutralizing agent | | | | | | |
| | TEA | 11.0 | 12.4 | 12.0 | 9.2 | 12.4 | 8.1 |
| | Ion exchange water | 838.0 | 837.5 | 848.5 | 839.7 | 837.2 | 863.7 |
| | Chain extender | | | | | | |
| | Ion exchange water | 48.4 | 48.9 | 37.9 | 46.7 | 49.1 | 22.6 |
| | 2-((2-aminoethyl)amino)ethanol | 24.2 | 24.4 | 18.9 | 23.3 | 24.6 | 11.3 |
| | KBM-603 | — | — | — | 2.1 | — | — |
| Characteristics | Solid content concentration (mass %) | 25 | 25 | 25 | 25 | 25 | 25 |
| | pH | 8.6 | 8.8 | 8.7 | 8.6 | 8.6 | 7.8 |
| | Viscosity (mPa · s (25° C.)) | 15 | 12 | 11 | 14 | 15 | 18 |
| | Average particle size (μm) | 60 | 42 | 65 | 55 | 62 | 50 |
| | urethane · urea group concentration (mass %) | 39.6 | 40.0 | 31.0 | 39.8 | 40.2 | 14.0 |

The abbreviations in Tables are shown below.

m-XDI: TAKENATE 500, 1,3-xylylene diisocyanate, m-XDI, manufactured by Mitsui Chemicals, Inc.

H6XDI: TAKENATE 600, 1,3-bis(isocyanatomethyl) cyclohexane, 1,3-H$_6$XDI, manufactured by Mitsui Chemicals, Inc.

H12MDI: Vestanat H$_{12}$MDI, 4,4'-methylenebis(cyclohexyl isocyanate), manufactured by Evonic Corporation IPDI: Vestanat IPDI, isophorone diisocyanate, IPDI, manufactured by Evonic Corporation PP440: DIOL 400, polyoxypropyleneetherglycol, number average molecular weight 400, manufactured by Mitsui Chemicals, Inc.

U-5620: TAKELAC U-5620, polyesterpolyol having a number average molecular weight of 2000, manufactured by Mitsui Chemicals, Inc.

MEK: methyl ethyl ketone

TEA: Triethylamine

KBM-603: trade name, N-2-aminoethyl)-3-aminopropyltrimethoxysilane, manufactured by Shin-Etsu Chemical Co. Ltd.

Formulation Example 1 (Preparation of Coating Liquid A)

To 56.43 g of ion-exchange water, 15 g of 2-propanol was added, and the mixture was mixed with a magnetic stirrer for 10 minutes. Thereafter, 27.43 g of PUD 1 prepared in Synthesis Example 1 was gradually added, and the mixture was mixed for 10 minutes. Then, 1.14 g of TAKENATE WD-725 (water dispersible polyisocyanate, manufactured by Mitsui Chemicals, Inc.) was added, and the mixture was further mixed for 20 minutes, thereby preparing coating liquid A. The weight ratio of the urethane resin and the water dispersible polyisocyanate in the coating liquid was 6/1.

Formulation Examples 2 to 5, 8, 10 to 13 (Preparation of Coating Liquids B to E, H, J to M)

The coating liquids B to E. H, and J to M were prepared in the same manner as in Formulation Example 1, except that the blending formulation shown in Table 2 was used.

Formulation Example 6 (Preparation of Coating Liquid F)

To 54.5 g of ion-exchange water, 15 g of 2-propanol was added, and the mixture was mixed with a magnetic stirrer for 10 minutes. Thereafter, 30.0 g of PUD 1 prepared in Synthesis Example 1 was gradually added, and the mixture was mixed for 10 minutes. Then, 0.5 g of 3-glycidoxypropyltrimethoxysilane (KBM403, manufactured by Shin-Etsu Chemical Co., Ltd.) was added, and the mixture was further mixed for 20 minutes, thereby preparing coating liquid F.

Formulation Example 7 (Preparation of Coating Liquid G)

To 53.0 g of ion-exchange water, 15 g of 2-propanol was added, and the mixture was mixed with a magnetic stirrer for 10 minutes. Thereafter, 32.0 g of PUD 1 prepared in Synthesis Example 1 was gradually added, and the mixture was mixed for 10 minutes, thereby preparing coating liquid G.

Formulation Example 9 (Preparation of Coating Liquid I)

To 55.30 of ion-exchange water, 15 g of 2-propanol was added, and the mixture was mixed with a magnetic stirrer for 10 minutes. Thereafter, 25.8 g of PUD 1 prepared in Synthesis Example 1 was gradually added, and the mixture was mixed for 10 minutes. Then, 3.90 g of Carbodilite V-02 (water dispersible carbodiimide, manufactured by Nisshinbo Chemical Inc.) was added, and the mixture was further mixed for 20 minutes, thereby preparing coating liquid I.

The blending formulation in each Formulation Example is shown in Table 2.

TABLE 2

| | | Formulation Example 1 | Formulation Example 2 | Formulation Example 3 | Formulation Example 4 | Formulation Example 5 | Formulation Example 6 | Formulation Example 7 |
|---|---|---|---|---|---|---|---|---|
| Blending formulation (parts by mass) | Components | Coating liquid A | Coating liquid B | Coating liquid C | Coating liquid D | Coating liquid E | Coating liquid F | Coating liquid G |
| | PUD1 | 27.43 | — | — | — | — | 30.00 | 32.00 |
| | PUD2 | — | 27.43 | — | — | — | — | — |
| | PUD3 | — | — | 27.43 | | | — | — |
| | PUD4 | — | — | — | 27.43 | | — | — |
| | PUD5 | — | — | — | — | 27.43 | — | — |
| | PUD6 | — | — | — | — | — | — | — |
| | Ion exchange water | 56.43 | 56.43 | 56.43 | 56.43 | 56.43 | 54.50 | 53.00 |
| | 2-propanol | 15.00 | 15.00 | 15.00 | 15.00 | 15.00 | 15.00 | 15.00 |
| | TAKENATE WD-725 | 1.14 | 1.14 | 1.14 | 1.14 | 1.14 | — | — |
| | Carbodilite V-02 | — | — | — | — | — | — | — |
| | KBM-403 | — | — | — | — | — | 0.50 | — |
| | Total | 100.00 | 100.00 | 100.00 | 100.00 | 100.00 | 100.00 | 100.00 |
| Resin component in polyurethane dispersion/resin component in water dispersible polyisocyanate (mass ratio) | | 6/1 | 6/1 | 6/1 | 6/1 | 6/1 | — | — |

TABLE 2-continued

|  |  | Formulation Example 8 | Formulation Example 9 | Formulation Example 10 | Formulation Example 11 | Formulation Example 12 | Formulation Example 13 |
|---|---|---|---|---|---|---|---|
| Blending formulation (parts by mass) | Components | Coating liquid H | Coating liquid I | Coating liquid J | Coating liquid K | Coating liquid L | Coating liquid M |
|  | PUD1 | — | 25.80 | 30.40 | 28.80 | 22.40 | 16.00 |
|  | PUD2 | — | — | — | — | — | — |
|  | PUD3 | — | — | — | — | — | — |
|  | PUD4 | — | — | — | — | — | — |
|  | PUD5 | — | — | — | — | — | — |
|  | PUD6 | 27.43 | — | — | — | — | — |
|  | Ion exchange water | 56.43 | 55.30 | 54.20 | 55.40 | 60.20 | 65.00 |
|  | 2-propanol | 15.00 | 15.00 | 15.00 | 15.00 | 15.00 | 15.00 |
|  | TAKENATE WD-725 | 1.14 | — | 0.40 | 0.80 | 2.40 | 4.00 |
|  | Carbodilite V-02 | — | 3.90 | — | — | — | — |
|  | KBM-403 | — | — | — | — | — | — |
|  | Total | 100.00 | 100.00 | 100.00 | 100.00 | 100.00 | 100.00 |
| Resin component in polyurethane dispersion/resin component in water dispersible polyisocyanate (mass ratio) |  | 6/1 | — | 19/1 | 9/1 | 2.3/1 | 1/1 |

The abbreviations in Tables are shown below.
TAKENATE WD-725: water dispersible polyisocyanate, polyalkylene oxide-modified polyisocyanate, manufactured by Mitsui Chemicals, Inc.
Carbodilite V-02: water dispersible carbodiimide (carbodiimide curing agent), manufactured by Nisshinbo Chemical Inc.
KBM-403: 3-glycidoxypropyltrimethoxysilane (epoxysilane curing agent), manufactured by Shin-Etsu Chemical Co., Ltd.
Component Analysis
The content ratio of the following groups in 100 mass % (that is, polyurethane layer) of the solid content in the coating liquid was calculated based on the structure and the ratio of the charged amount of the material components used:

(A) xylylene group and/or hydrogenated xylylene group,
(B) alkylene group having 2 to 6 carbon atoms,
(C) polyalkylene oxide group,
(D) alkylene group containing an ionic group, and/or, arylene group containing an ionic group, and
(E) at least one group selected from the group consisting of alkylene group having an amino group, arylene group having an amino group, alkylene group having a thiol group, and, arylene group having a thiol group.

The content ratio of the groups in the solid content of the coating liquid is shown in Table 3.
The content ratio of each group in the solid content in the coating liquid is the same also in the film layer produced by applying the coating liquid and dried.

TABLE 3

|  |  | Coating liquid A | Coating liquid B | Coating liquid C | Coating liquid D | Coating liquid E |
|---|---|---|---|---|---|---|
| Content ratio of each group (mass %) | (A) xylylene group, hydrogenated xylylene group | 27.2 | 32.1 | 21.3 | 27.3 | 31.7 |
|  | (B) alkylene group having 2 to 6 carbon atoms | 10.5 | 9.8 | 7.2 | 9.8 | 10.1 |
|  | (C) polyalkylene oxide group | 2.9 | 2.9 | 2.9 | 2.9 | 2.9 |
|  | (D) alkylene group containing ionic group, arylene group containing ionic group | 3.8 | 4.3 | 4.1 | 3.2 | 4.3 |
|  | (E) alkylene group/arylene group having amino group/thiol group | 5.8 | 5.9 | 4.6 | 6.2 | 5.9 |

|  |  | Coating liquid F | Coating liquid G | Coating liquid H | Coating liquid I |
|---|---|---|---|---|---|
| Content ratio of each group (mass %) | (A) xylylene group, hydrogenated xylylene group | 29.7 | 31.7 | 0.0 | 25.5 |
|  | (B) alkylene group having 2 to 6 carbon atoms | 7.9 | 5.9 | 5.4 | 12.1 |
|  | (C) polyalkylene oxide group | 0.0 | 0.0 | 2.9 | 0.0 |
|  | (D) alkylene group containing ionic group, arylene group containing ionic group | 4.1 | 4.4 | 2.8 | 3.6 |
|  | (E) alkylene group/arylene group having | 6.4 | 6.8 | 2.7 | 5.5 |

TABLE 3-continued amino group/thiol group

| | | No. | | | |
|---|---|---|---|---|---|
| | | Coating liquid J | Coating liquid K | Coating liquid L | Coating liquid M |
| Content ratio of each group (mass %) | (A)xylylene group, hydrogenated xylylene group | 30.1 | 28.5 | 22.2 | 15.8 |
| | (B)alkylene group having 2 to 6 carbon atoms | 7.5 | 9.1 | 15.4 | 22.0 |
| | (C)polyalkylene oxide group | 1.0 | 2.0 | 6.0 | 10.0 |
| | (D)alkylene group containing ionic group, arylene group containing ionic group | 4.2 | 4.0 | 3.1 | 2.2 |
| | (E)alkylene group/arylene group having amino group/thiol group | 6.5 | 6.1 | 4.8 | 3.4 |

Example 1

The coating liquid A was applied on a corona discharge-treated surface of a cast polypropylene film (Tohcello CP RXC-22 (CPP film), #60, manufactured by Mitsui Chemicals Tohcello Co., Ltd.) as a substrate (sealant layer) so that its thickness after drying was 0.5 g/m² using a bar coater, and drying was performed for 1 minute in a drying oven with its temperature set to 80° C.

The coated film was aged for 2 days at 40° C., and thereafter, set in a vacuum aluminum vapor deposition apparatus (Showa Shinku Co., Ltd., SIP 600). Then, aluminum was placed as a vapor deposition source, and then the degree of vacuum in the vapor deposition chamber was set to $2 \times 10^{-3}$ mbar. Thereafter, the electric current value was gradually increased, and at 700 mA, aluminum was melted to cause vapor deposition of aluminum for a total vapor deposition time of 3 seconds, thereby forming a laminate.

Example 2

A laminate was formed in the same manner as in Example 1, except that a low-density polyethylene film (LLDPE film, manufactured by Mitsui Chemicals Tohcello Co., Ltd., trade name TUXHC, thickness 60 µm) was used instead of the cast polypropylene film, and furthermore, 0.2 g of BYK-348 (leveling agent, manufactured by BYK Additives & Instruments) was added relative to 100 g of the coating liquid A.

Examples 3 to 10, and Comparative Examples 2, 5, and 6

A laminate was formed in the same manner as in Example 1, except that instead of the coating liquid A, the coating liquid B was used in Example 3, the coating liquid C was used in Example 4, the coating liquid D was used in Example 5, the coating liquid E was used in Example 6, the coating liquid J was used in Example 7, the coating liquid K was used in Example 8, the coating liquid L was used in Example 9, the coating liquid M was used in Example 10, the coating liquid G was used in Comparative Example 2, the coating liquid F was used in Comparative Example 5, and the coating liquid H was used in Comparative Example 6.

Comparative Example 1

A laminate was formed in the same manner as in Example 1, except that the coating liquid A of Example 1 was not used (that is, the polyurethane layer was not formed).

Comparative Example 3

Aluminum was vapor deposited on the corona discharged surface of the cast polypropylene film in the same manner as in Example 1, then, the coating liquid A was applied over the vapor deposited aluminum surface so that the its thickness after drying was 0.5 g/m² using a bar coater.

Thereafter, it was put into a drying oven with its temperature set to 80° C., drying was performed for 1 minute, and aged at 40° C. for 2 days, thereby producing a laminate.

Comparative Example 4

A laminate was produced in the same manner as in Comparative Example 3, except that the coating liquid G was used.

Comparative Example 7

A laminate was produced in the same manner as in Comparative Example 1, except that a low-density polyethylene film (LLDPE film, manufactured by Mitsui Chemicals Tohcello Co., Ltd. trade name TUXHC, thickness 60 µm) was used instead of the cast polypropylene film.

Comparative Example 8

A laminate was produced in the same manner as in Example 2, except that the coating liquid I was used instead of the coating liquid A.

Example 11

A laminate was produced in the same manner as in Example 1, except that a biaxially oriented polypropylene film (PYLEN P-2161, thickness 20 µm, manufactured by TOYOBO Co., Ltd.) was used instead of the cast polypropylene film.

Comparative Example 9

A laminate was produced in the same manner as in Example 11, except that the coating liquid G was used instead of the coating liquid A.

Evaluation

The laminates produced in Examples and Comparative Examples were evaluated with the following procedures. The results are shown in Table 4.

<Oxygen Transmittance>

The oxygen transmittance of the laminate was measured under the conditions of 20° C. and relative humidity of 80% (80% RH) with an oxygen transmittance measurement device (manufactured by MOCON, Inc., OX-TRAN 2/20).

The oxygen transmission amount was measured as the oxygen transmission amount per 1 m$^2$, 1 day, and 1 atmospheric pressure.

The results are shown in Table 4.

<Adherence (Laminate Strength)>

A mixture (TAKELAC A-310/TAKENATE A-3=10/1 (mass ratio)) of TAKELAC A-310 (manufactured by Mitsui Chemicals, Inc.) and TAKENATE A-3 (manufactured by Mitsui Chemicals, Inc.) as dry lamination adhesives was applied on the aluminum vapor deposited surface of the laminate with a bar coater so that the thickness after drying was 3.0 g/m$^2$, and dried with a dryer.

Then, a polyethylene terephthalate film (PET film, manufactured by TOYOBO Co., Ltd., trade name E 5102, thickness 12 μm) was laminated on the adhesive-applied surface of the laminate, and aged at 40° C. for 2 days.

Then, laminate strength was measured with T-peel test (15 mm width) in conformity with JIS K 6854 (1999).

<Heat Sealability>

The substrate (sealant layer)-side faces of the laminates were set to a heat sealer (TESTER SANGYO CO., LTD., TP-701-B HEAT SEAL TESTER), and heat sealing was conducted under the conditions of a pressure of 1.5 kg/cm$^2$, time of 1 second, a width of 1 cm, with the temperature conditions shown in Table 4.

Thereafter, heat seal strength was measured with T-peel test (15 mm width) in conformity with JIS K 6854 (1999).

In the case where the laminate was broken without peeling off at the heat sealed portion, it was noted as "material breakage".

TABLE 4

| | | | | | | | No. | | | | | |
|---|---|---|---|---|---|---|---|---|---|---|---|---|
| | | Example 1 | Example 2 | Example 3 | Example 4 | Example 5 | Example 6 | Example 7 | Example 8 | Example 9 | Example 10 |
| Laminate | Coating liquid | Coating liquid A | Coating liquid A | Coating liquid B | Coating liquid C | Coating liquid D | Coating liquid E | Coating liquid J | Coating liquid K | Coating liquid L | Coating liquid M |
| | Laminate No. | Laminate 1 | Laminate 2 | Laminate 3 | Laminate 4 | Laminate 5 | Laminate 6 | Laminate 7 | Laminate 8 | Laminate 9 | Laminate 10 |
| | Substrate | CPP | LLDPE | CPP | CPP | CPP | CPP | CPP | CPP | CPP | CPP |
| | Polyurethane layer | Anchor | Anchor | Anchor | Anchor | Anchor | Anchor | Anchor | Anchor | Anchor | Anchor |
| | Metal deposition layer | Present | Present | Present | Present | Present | Present | Present | Present | Present | Present |
| Evaluation | Oxygen transmittance (cc/day · m2 · atm) | 0.5 | 2.0 | 0.7 | 2.2 | 0.6 | 0.9 | 0.4 | 0.5 | 1.8 | 3.2 |
| | Laminate strength (N/15 mm) | 4.0 | 2.0 | 4.0 | 4.5 | 5.0 | 3.0 | 2.5 | 3.5 | 4.0 | 4.0 |
| | Heat sealing temperature (° C.) | 160 | 130 | 160 | 160 | 160 | 160 | 160 | 160 | 160 | 160 |
| | Heat seal strength (N/10 mm) | Material breakage | Material breakage | Material breakage | Material breakage | Material breakage | Material breakage | Material breakage | Material breakage | Material breakage | Material breakage |

| | | | | | No. | | | | |
|---|---|---|---|---|---|---|---|---|---|
| | | Comp. Ex. 1 | Comp Ex. 2 | Comp Ex. 3 | Comp Ex. 4 | Comp Ex. 5 | Comp Ex. 6 | Comp Ex. 7 | Comp Ex. 8 |
| Laminate | Coating liquid | — | Coating liquid G | Coating liquid A | Coating liquid G | Coating liquid F | Coating liquid H | — | Coating liquid I |
| | Laminate No. | Laminate 11 | Laminate 12 | Laminate 13 | Laminate 14 | Laminate 15 | Laminate 16 | Laminate 17 | Laminate 18 |
| | Substrate | CPP | CPP | CPP | CPP | CPP | CPP | LLDPE | LLDPE |
| | Polyurethane layer | Absent | Anchor | Over | Over | Anchor | Anchor | Absent | Anchor |
| | Metal deposition layer | Present | Present | Present | Present | Present | Present | Present | Present |
| Evaluation | Oxygen transmittance (cc/day · m2 · atm) | 38 | 0.6 | 0.9 | 0.8 | 0.6 | 42 | 98 | 2.0 |
| | Laminate strength (N/15 mm) | 2.1 | 0.4 | 1.8 | 0.1 | 0.6 | 3.8 | 0.1 | 0.1 |
| | Heat sealing temperature (° C.) | 160 | 160 | 160 | 160 | 160 | 160 | 130 | 130 |
| | Heat seal strength (N/10 mm) | Material breakage | 0.7 | Material breakage | 0.6 | 0.2 | Material breakage | Material breakage | Material breakage |

| | | No. | |
|---|---|---|---|
| | | Example 11 | Comp. Ex. 9 |
| Laminate | Coating liquid | Coating liquid A | Coating liquid G |
| | Laminate No. | Laminate 19 | Laminate 20 |
| | Substrate | CPP | CPP |
| | Polyurethane layer | Anchor | Anchor |
| | Metal deposition layer | Present | Present |

TABLE 4-continued

| Evaluation | | | |
|---|---|---|---|
| Oxygen transmittance (cc/day · m2 · atm) | 2.1 | 1.8 |
| Laminate strength (N/15 mm) | 1.8 | 0.03 |
| Heat sealing temperature (° C.) | 160 | 160 |
| Heat seal strength (N/10 mm) | 0.01 | 0.02 |
| Heat sealing temperature (° C.) | 170 | 170 |
| Heat seal strength (N/10 mm) | Film contraction | Film contraction |

The abbreviations in Tables are shown below.
CPP: cast polypropylene film, Tohcello CP RXC-22, CPP film, #60, manufactured by Mitsui Chemicals Tohcello Co., Ltd.
LLDPE: low-density polyethylene film, LLDPE film, manufactured by Mitsui Chemicals Tohcello Co., Ltd., trade name TUXHC, thickness 60 μm
OPP: biaxially oriented polypropylene film, PYLEN P-2161, thickness 20 μm, manufactured by TOYOBO Co., Ltd.

<Consideration>

It was confirmed that the laminate of Examples, which corresponds to the configuration of the present invention, had excellent gas barrier properties and laminate strength compared with the laminate of Comparative Examples, which did not correspond to the configuration of the present invention.

In particular, referring to Examples 1, 2, and 11, in which the same coating liquid was used and the types of the substrate was changed variously, it was confirmed that the laminate achieved excellent gas barrier properties and laminate strength independent of the substrate types.

Meanwhile, for example, the laminate of Comparative Example 6 had poor laminate strength even though the substrate type was the same as that one in Example 1, because the coating liquid was different.

The laminate produced in Comparative Example 4 had a low laminate strength. This is assumed that pinholes and cracks generated in the metal vapor deposition layer and the coating liquid G had effects.

While the illustrative embodiments of the present invention are provided in the above description, such is for illustrative purpose only and it is not to be construed as limiting in any manner. Modification and variation of the present invention that will be obvious to those skilled in the art is to be covered by the following claims.

INDUSTRIAL APPLICABILITY

The laminate, the food packaging material including the laminate, and the method for producing a laminate of the present invention are suitably used in the fields of packaging materials that require gas barrier properties, such as packaging materials for pharmaceutical products, food packaging materials, optical films, and industrial films, and in particular, suitably used in the field of food packaging materials.

DESCRIPTION OF REFERENCE NUMERALS

1 Laminate film
2 Substrate
3 Polyurethane layer
4 Metal vapor deposition layer

The invention claimed is:

1. A laminate including a substrate composed of a heat sealable plastic film, a polyurethane layer having gas barrier properties and formed on the substrate, and a metal vapor deposition layer formed on the polyurethane layer,
   wherein the polyurethane layer is produced on the substrate by applying and drying, a coating liquid containing a water dispersible polyisocyanate and a polyurethane dispersion containing polyurethane resin produced by reaction of an isocyanate group-terminated prepolymer with a chain extender,
   the isocyanate group-terminated prepolymer is produced by reaction of a polyisocyanate component including xylylene diisocyanate and/or hydrogenated xylylene diisocyanate and a polyol component including diol having 2 to 6 carbon atoms and an active hydrogen group-containing compound containing a hydrophilic group.

2. The laminate according to claim 1, wherein the mass ratio of the resin component in the polyurethane dispersion to the resin component in the water dispersible polyisocyanate is in the range of 2/1 to 99/1.

3. The laminate according to claim 1, wherein the substrate is a cast polyolefin film.

4. The laminate according to claim 1, wherein the metal vapor deposition layer is an aluminum layer.

5. A food packaging material including the laminate according to claim 1.

6. A laminate including a substrate, a polyurethane layer consisting of polyurethane resin, and a metal vapor deposition layer formed in this order,
   wherein the substrate is a polyolefin film,
   the polyurethane layer contains the following groups relative to 100 mass % of the polyurethane layer as a whole at the percentage below:
   (A) xylylene group and/or hydrogenated xylylene group: 10 mass % or more and 45 mass % or less,
   (B) alkylene group having 2 to 6 carbon atoms: 0.5 mass % or more and 25 mass % or less,
   (C) polyalkylene oxide group: 0.5 mass % or more and 10 mass % or less,
   (D) alkylene group containing an ionic group, and/or, arylene group containing an ionic group: 1 mass % or more and 25 mass % or less, and
   (E) at least one group selected from the group consisting of an alkylene group having an amino group, an arylene group having an amino group, an alkylene group having a thiol group, and an arylene group having a thiol group: 1 mass % or more and 25 mass % or less.

7. A food packaging material including the laminate according to claim 6.

8. A method for producing a laminate, the method including:
   forming a polyurethane layer consisting of polyurethane resin on a substrate composed of a heat sealable plastic film, and forming a metal vapor deposition layer on the polyurethane layer, thereby producing a laminate,
   wherein in the formation of the polyurethane layer,
   a coating liquid is applied on the substrate and dried, the coating liquid contains polyurethane dispersion and water dispersible polyisocyanate, the polyurethane dispersion contains polyurethane resin produced by reaction of an isocyanate group-terminated prepolymer and a chain extender, the isocyanate group-terminated prepolymer is produced by reaction of a polyisocyanate component including xylylene diisocyanate and/or hydrogenated xylylene diisocyanates and a polyol component including diol having 2 to 6 carbon atoms and an active hydrogen group-containing compound containing an ionic group.

* * * * *

UNITED STATES PATENT AND TRADEMARK OFFICE
CERTIFICATE OF CORRECTION

PATENT NO. : 10,434,751 B2
APPLICATION NO. : 15/556306
DATED : October 8, 2019
INVENTOR(S) : Takashi Uchida et al.

Page 1 of 1

It is certified that error appears in the above-identified patent and that said Letters Patent is hereby corrected as shown below:

In the Specification

Column 34, Table 4, under Example 11, -CPP- should read --OPP--.

Column 34, Table 4, under Comp. Ex. 9, -CPP- should read --OPP--.

Signed and Sealed this
Seventh Day of January, 2020

Andrei Iancu
*Director of the United States Patent and Trademark Office*